(12) United States Patent
Kondo et al.

(10) Patent No.: US 11,828,804 B2
(45) Date of Patent: Nov. 28, 2023

(54) LOAD TEST APPARATUS

(71) Applicant: TATSUMI RYOKI CO., LTD, Tokyo (JP)

(72) Inventors: Toyoshi Kondo, Tokyo (JP); Nobuhide Hamano, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 734 days.

(21) Appl. No.: 17/001,062

(22) Filed: Aug. 24, 2020

(65) Prior Publication Data

US 2020/0386813 A1 Dec. 10, 2020

Related U.S. Application Data

(63) Continuation of application No. PCT/JP2019/008577, filed on Mar. 5, 2019, and a continuation-in-part of application No. PCT/JP2018/030020, filed on Aug. 10, 2018, and a
(Continued)

(51) Int. Cl.
*G01R 31/34* (2020.01)
*G06F 1/20* (2006.01)

(52) U.S. Cl.
CPC .............. *G01R 31/34* (2013.01); *G06F 1/206* (2013.01)

(58) Field of Classification Search
CPC ................................ G01R 31/34; G06F 1/206
See application file for complete search history.

(56) References Cited

U.S. PATENT DOCUMENTS 6,078,171 A * 6/2000 Kondoh ................. G01R 1/203
323/354
6,653,928 B1 * 11/2003 Kondo ................... G01R 1/203
338/319
(Continued)

FOREIGN PATENT DOCUMENTS

CN 102411067 A 4/2012
CN 202563073 U 11/2012
(Continued)

OTHER PUBLICATIONS

International Search Report issued in PCT/JP2019/008577 dated May 14, 2019 with English Translation (5 pages).
(Continued)

*Primary Examiner* — Rina I Duda
(74) *Attorney, Agent, or Firm* — Nakanishi IP Associates, LLC

(57) ABSTRACT

A load test apparatus includes: a first resistance unit that has a plurality of first resistors and a first holding part holding the plurality of first resistors; and a first cooling part that includes a cooling device sending cooling air to the plurality of first resistors; a control part that includes a power source terminal part connected to a power source to be tested and an operation part; and a relay part that includes a switching device connected to the power source terminal part and the first resistance unit. The cooling device in the first cooling part faces one first opening in the first holding part. The first cooling part and the first resistance unit are arranged in a third direction (z direction) orthogonal to a first direction (x direction) and a second direction (y direction), and a first load test part.

11 Claims, 21 Drawing Sheets

Related U.S. Application Data continuation-in-part of application No. PCT/JP2018/009647, filed on Mar. 13, 2018.

(56) References Cited

U.S. PATENT DOCUMENTS

| | | | | |
|---|---|---|---|---|
| 6,833,636 | B1* | 12/2004 | Nestel | G01R 1/203 307/154 |
| 8,878,558 | B2* | 11/2014 | Kondo | G01R 31/40 324/750.01 |
| 9,488,694 | B2* | 11/2016 | Kondo | G01R 31/40 |
| 9,500,718 | B2* | 11/2016 | Kondo | G01R 31/40 |
| 2006/0097840 | A1* | 5/2006 | Matsumoto | H01C 1/02 338/64 |
| 2013/0328660 | A1 | 12/2013 | Sshott et al. | |
| 2014/0210495 | A1 | 7/2014 | Kondo | |
| 2015/0198636 | A1* | 7/2015 | Kondo | G01R 19/165 324/713 |
| 2017/0315184 | A1* | 11/2017 | Morin | G01R 31/40 |

FOREIGN PATENT DOCUMENTS

| | | |
|---|---|---|
| CN | 104024876 A | 9/2014 |
| JP | H6-034725 A | 2/1994 |
| JP | H6-120002 A | 4/1994 |
| JP | H7-208844 A | 8/1995 |
| JP | H09-15307 A | 1/1997 |
| JP | 2010-25752 A | 2/2010 |
| JP | 3160347 U | 6/2010 |
| JP | 2013-191602 A | 9/2013 |
| JP | 2014-504001 A | 2/2014 |
| JP | 2014-137337 A | 7/2014 |
| JP | 2014-183061 A | 9/2014 |
| JP | 2015-087276 A | 5/2015 |
| JP | 2016-133329 A | 7/2016 |
| JP | 2018-054499 A | 4/2018 |
| WO | 2017/072823 A1 | 5/2017 |
| WO | 2018/225152 A1 | 12/2018 |

OTHER PUBLICATIONS

International Search Report issued in PCT/JP2018/009647 dated Jun. 12, 2018 with English Translation (5 pages).
International Search Report issued in PCT/JP2018/030020 dated Nov. 6, 2018 with English Translation (5 pages).
Extended European Search Report issued in European Patent Application No. 19768647.0, dated Oct. 15, 2021 (6 pages).
Office Action issued in Japanese Patent Application No. 2020-069483 dated Aug. 25, 2022, with English Translation (14 pages).
Office Action issued in Chinese Patent Application No. 201980015736.7 dated Aug. 9, 2022 and Search Record dated Aug. 3, 2022, with English Translation (20 pages).
Author: 18201, "Resistor pantographic insertion (Spiders 12. Spiders 11)", Aug. 1, 2009 (online), N de former country, (searched on Aug. 16, Reiwa 4), the Internet URL: http://18201.blog107.fc2.com/blog entry-480.html (documents showing well-known arts)(2022), with English Translation (10 pages).

* cited by examiner

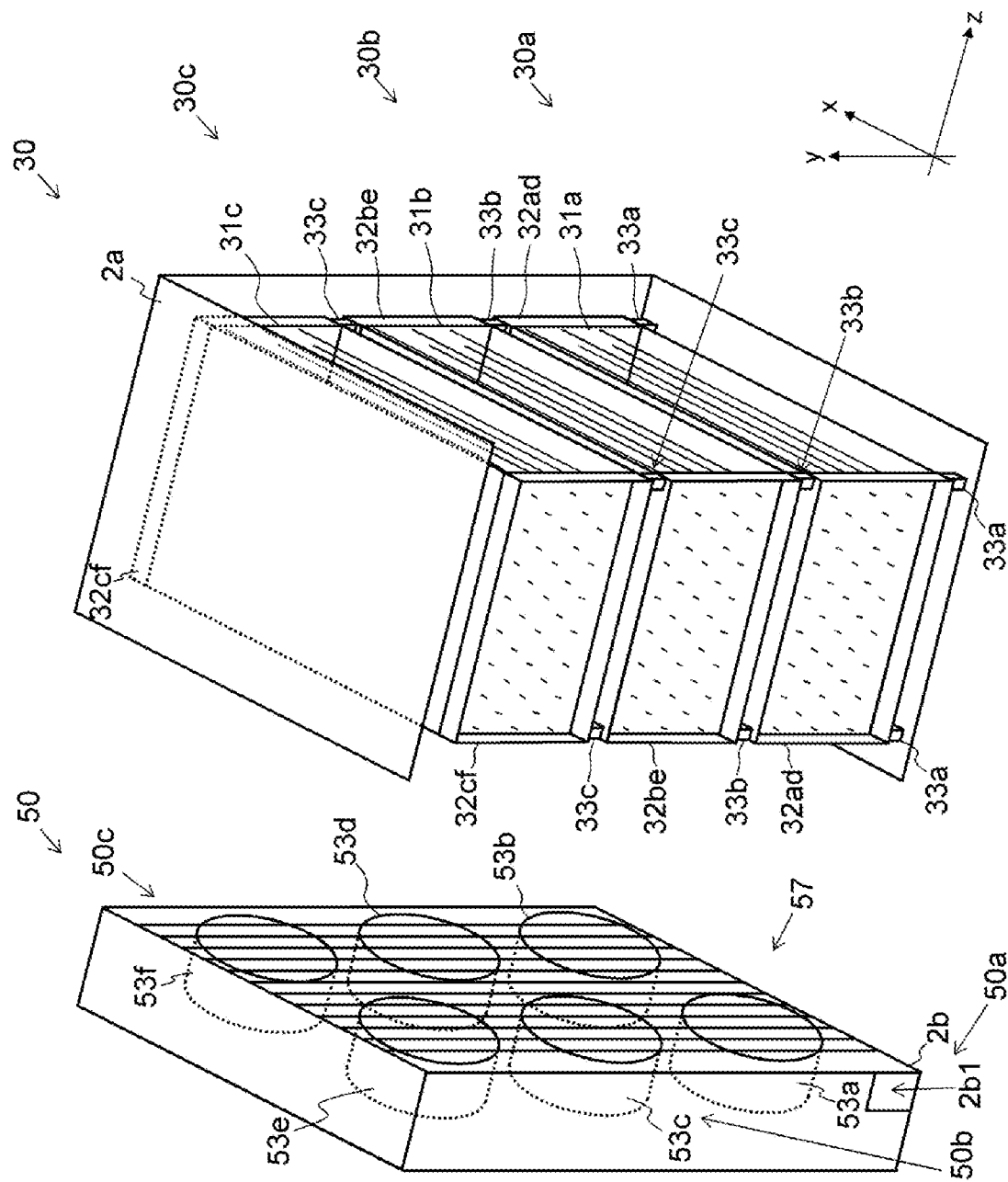

LOAD TEST APPARATUS

CROSS-REFERENCE TO RELATED APPLICATIONS

This application is a continuation application of International Patent Application No. PCT/JP2019/008577 filed on Mar. 5, 2019, and is also a continuation-in-part application of International Patent Application No. PCT/JP2018/009647 filed on Mar. 13, 2018, and is also a continuation-in-part of International Patent Application No. PCT/JP2018/030020 filed on Aug. 10, 2018. The entire contents of the international applications are incorporated herein by reference.

TECHNICAL FIELD

The present invention relates to a load test apparatus.

BACKGROUND ART

There has been conventionally proposed a load test apparatus that performs a load test on a power generator, which includes a plurality of cooling devices and a plurality of resistance units, as disclosed in Patent Literature 1.

CITATION LIST

Patent Literature

Patent Literature 1: JP H09-15307 A

However, such a load test apparatus has required complicated process of assembly and wiring of parts such as a resistance unit.

SUMMARY OF INVENTION

One or more aspects of the present invention provide a load test apparatus that can be easily assembled or wired.

A load test apparatus according to one or more aspects of the present invention includes: a first resistance unit that has a plurality of first resistors and a first holding part holding the plurality of first resistors; a first cooling part that includes a cooling device sending cooling air to the plurality of first resistors; a control part (e.g., including one or more processors) that includes a power source terminal part connected to a power source to be tested and an operation part; and a relay part that includes a switching device connected to the power source terminal part and the first resistance unit. The cooling device in the first cooling part faces one first opening in the first holding part. The first cooling part and the first resistance unit are arranged in a third direction orthogonal to a first direction in which the plurality of first resistors extends and a second direction that is orthogonal to the first direction and in which the plurality of first resistors is arranged. A first load test part including the first resistance unit and the first cooling part, the relay part, and the control part are arranged in the first direction.

This arrangement makes it possible to efficiently align the members of the load test apparatus in a narrow space, and to facilitate assembly of the respective parts, wiring from the control part to the resistance unit, and wiring from the control part to the cooling part.

The load test apparatus may include: a second resistance unit that has a plurality of second resistors and a second holding part holding the plurality of second resistors; and a second cooling part that includes a cooling device sending cooling air to the plurality of second resistors. The first holding part is arranged on a housing that holds the first resistance unit with a first insulator therebetween. The second holding part is arranged on the first holding part with a second insulator therebetween. The cooling device in the second cooling part faces one second opening in the second holding part. The first insulator is attached between the housing and a first lower projection that protrudes in a horizontal direction from a lower portion of the first holding part. The second insulator is attached between a first upper projection that protrudes in the horizontal direction from an upper portion of the first holding part and a second lower projection that protrudes in the horizontal direction from a lower portion of the second holding part.

The insulators can be screwed using an empty space below the upper projection and an empty space above the lower projection. Thus, the insulators can be easily installed as compared to a mode in which the insulators are installed on the lower portion of the holding part.

The load test apparatus may include: a third resistance unit that has a plurality of third resistors and a third holding part holding the plurality of third resistors; and a third cooling part that includes a cooling device sending cooling air to the plurality of third resistors. The third holding part is arranged on the second holding part with a third insulator therebetween. The cooling device in the third cooling part faces one third opening in the third holding part. A lower surface and side surface of the first resistance unit, a side surface of the second resistance unit, and an upper surface and a side surface of the third resistance unit are covered by the housing. The third insulator is attached between a second upper projection that protrudes in the horizontal direction from an upper portion of the second holding part and a third lower projection that protrudes in the horizontal direction from a lower portion of the third holding part.

A diffusion part for diffusing cooling air may be provided between the first cooling part and the first resistance unit. The diffusion part includes an opening/closing door that closes an exhaust port of the first cooling part by urging. The opening/closing door is opened by cooling air discharged from the first cooling part.

Providing the diffusion part between the cooling part and the resistance unit makes it possible to diffuse cooling air in the first direction or the like so that cooling air can be substantially uniformly exposed to entire the resistors.

At least one of an intake port and an exhaust port of the first cooling part and an exhaust port of the first resistance unit may have an opening/closing door that is closed by urging and is opened by cooling air from the first cooling part.

During the non-use period, no air flows into the resistance unit so that dust and the like hardly enter from the outside.

A plurality of resistance groups and the relay parts may be provided. Each of the resistance groups has a resistance unit which includes the first resistance unit and has a cooling part which includes the first cooling part. The plurality of resistance groups is connected to the control part. The plurality of resistance groups is arranged in the third direction.

This makes it possible to perform a load test with a large load while sharing the control part, as compared with a mode in which only a first resistance group is provided.

The plurality of resistance groups may include a first resistance group and a second resistance group. The number of the switching devices in the relay part of the first resistance group that performs a power supply control on the first resistance unit of the first resistance group is larger than the number of the switching devices in the relay part of the second resistance group that performs a power supply control on the first resistance unit of the second resistance group.

The first resistance group is mainly used to perform a load test with a small switching width of load resistance value. The second resistance group is mainly used to perform a load test with a large switching width of load resistance value. Both the first resistance group and the second resistance group can be used to perform a load test with a large load resistance value.

A plurality of resistance groups may be provided. Each of the resistance groups has a resistance unit which includes the first resistance unit and has a cooling part which includes the first cooling part. At least one of the plurality of resistance groups is connected to the control part via the relay part, and the rest of the plurality of resistance groups is connected to the control part via not the relay part but a VCS provided in the control part or in the resistance unit of the rest of the plurality of resistance groups.

An exhaust port hood may be provided at the exhaust port of the first resistance unit. The exhaust port hood is biased to close and is opened by cooling air from the first cooling part.

The exhaust port hood can be automatically opened and closed without using electric energy.

An exhaust port hood may be provided at the exhaust port of the first resistance unit. An intake port hood is provided at the intake port of the first cooling part. The load test apparatus further includes: a roof part that covers an upper part of a housing covering the first resistance unit, the cooling part, the control part, and the relay part; and a base part that is provided at a lower part of the housing. The roof part has a hipped roof.

Even when the load test apparatus is installed outdoors, it is possible to prevent the upper part of the housing from being directly hit by rain or snow. In addition, even when snow accumulates on the roof part, the snow can be easily dropped off by using the slope.

An exhaust port hood opened upward or obliquely upward may be provided at the exhaust port of the first resistance unit. An intake port hood opened upward or obliquely upward is provided at the intake port of the first cooling part. The load test apparatus further includes: a housing that covers the first resistance unit, the cooling part, the control part, and the relay part; and a roof part that covers upper portions of the exhaust port hood and the intake port hood.

The roof part makes it difficult for rain or snow to enter the opening in the second exhaust port hood or the opening in the second intake port hood.

Even when the load test apparatus is installed outdoors and snow piles up around the load test apparatus, it is possible to reduce the possibility that snow or melted water comes into contact with the electrical components constituting the load test apparatus.

The load test apparatus may include a second resistance unit that has a plurality of second resistors and a second holding part holding the plurality of second resistors. The first holding part is arranged on a housing that holds the first resistance unit with a first insulator therebetween. The second holding part is arranged on the first holding part with a second insulator therebetween. The first insulator is attached between the housing and a lower portion of a first protruding region that protrudes in a horizontal direction from the first holding part. The second insulator is attached between an upper portion of the first protruding region and a lower portion of a second protruding region that protrudes in the horizontal direction from the second holding part.

The portion corresponding to the upper projection and the portion corresponding to the lower projection are integrally formed as the protruding region, so that it is possible to increase the strength of the part to which the insulator is attached as compared to a mode in which the upper projection and the lower projection are separately formed.

The load test apparatus may include a third resistance unit that has a plurality of third resistors and a third holding part holding the plurality of third resistors. The third holding part is arranged on the second holding part with a third insulator therebetween. A lower surface and side surface of the first resistance unit, a side surface of the second resistance unit, and an upper surface and side surface of the third resistance unit are covered by the housing. The third insulator is attached between an upper portion of the second protruding region and a lower portion of a third protruding region that protrudes in the horizontal direction from the third holding part.

The first protruding region may be formed in a rectangular frame shape when viewed from the horizontal direction. The second protruding region is formed in a rectangular frame shape when viewed from the horizontal direction.

Forming the protruding region in a frame shape makes it possible to further increase the strength.

As described above, according to one or more aspects of the present invention, it is possible to provide a load test apparatus that can be easily assembled or wired.

BRIEF DESCRIPTION OF DRAWINGS

FIG. 21 is an exploded perspective view of a region including the cooling part including the diffusion part and the resistance unit including a frame-shaped protruding region.

DESCRIPTION OF EMBODIMENTS

Figure 1:
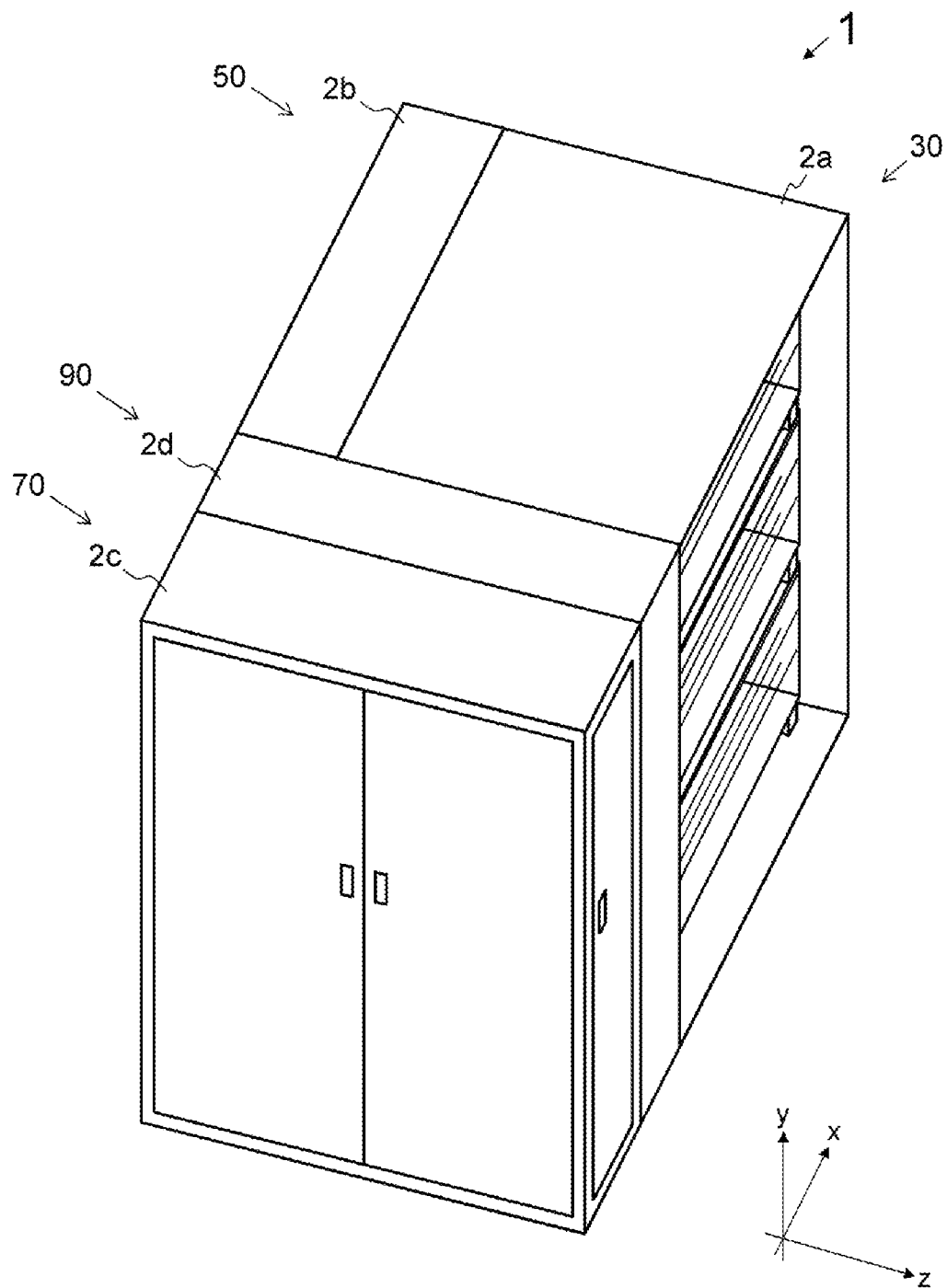
FIG. 1 is a perspective view of a load test apparatus according to one or more embodiments of the present invention.

Hereinafter, embodiments will be described with reference to the drawings.

Note that the embodiments are not limited to the following embodiments. The description of one embodiment is also applied to other embodiments in principle. Embodiments and modified examples can be appropriately combined.

A dry load test apparatus 1 according to the present embodiment includes a resistance unit 30, a cooling part 50, a control part 70, and a relay part 90 (see FIGS. 1 to 6).

The resistance unit 30 has a first housing 2a, a first resistance unit 30a, a second resistance unit 30b, and a third resistance unit 30c.

The first housing 2a covers the first resistance unit 30a, the second resistance unit 30b, and the third resistance unit 30c.

The cooling part 50 has a second housing 2b, a first cooling part 50a, a second cooling part 50b, and a third cooling part 50c.

The second housing 2b covers the first cooling part 50a, the second cooling part 50b, and the third cooling part 50c.

The following description is based on the assumption that the first resistance unit 30a and the first cooling part 50a constitute a first load test part 1a, the second resistance unit 30b and the second cooling part 50b constitute a second load test part 1b, and the third resistance unit 30c and the third cooling part 50c constitute a third load test part 1c.

As description of directions, one of the horizontal directions will be described as an x direction (side-to-side direction, first direction), the direction perpendicular to the x direction will be described as a y direction (vertical direction, second direction), and the horizontal direction perpendicular to the x and y directions will be described as a z direction (front-back direction, third direction).

The control part 70, the relay part 90, and the load test part are arranged in the x direction.

The first load test part 1a, the second load test part 1b, and the third load test part 1c are arranged in the y direction.

The cooling part 50 and the resistance unit 30 in the load test part are arranged in the z direction.

This arrangement makes it possible to efficiently align the members of the load test apparatus 1 in a narrow space, and to facilitate assembly of the respective parts, wiring from the control part 70 to the resistance unit 30, and wiring from the control part 70 to the cooling part 50.

FIGS. 1, 7, 12, 14, and 15 do not show portions that are invisible from the outside.

In order to indicate the boundary between the control part 70 and the relay part 90, a solid line is shown between the third housing 2c and the fourth housing 2d in the drawings. However, the third housing 2c and the fourth housing 2d may be integrally formed.

Figure 2:
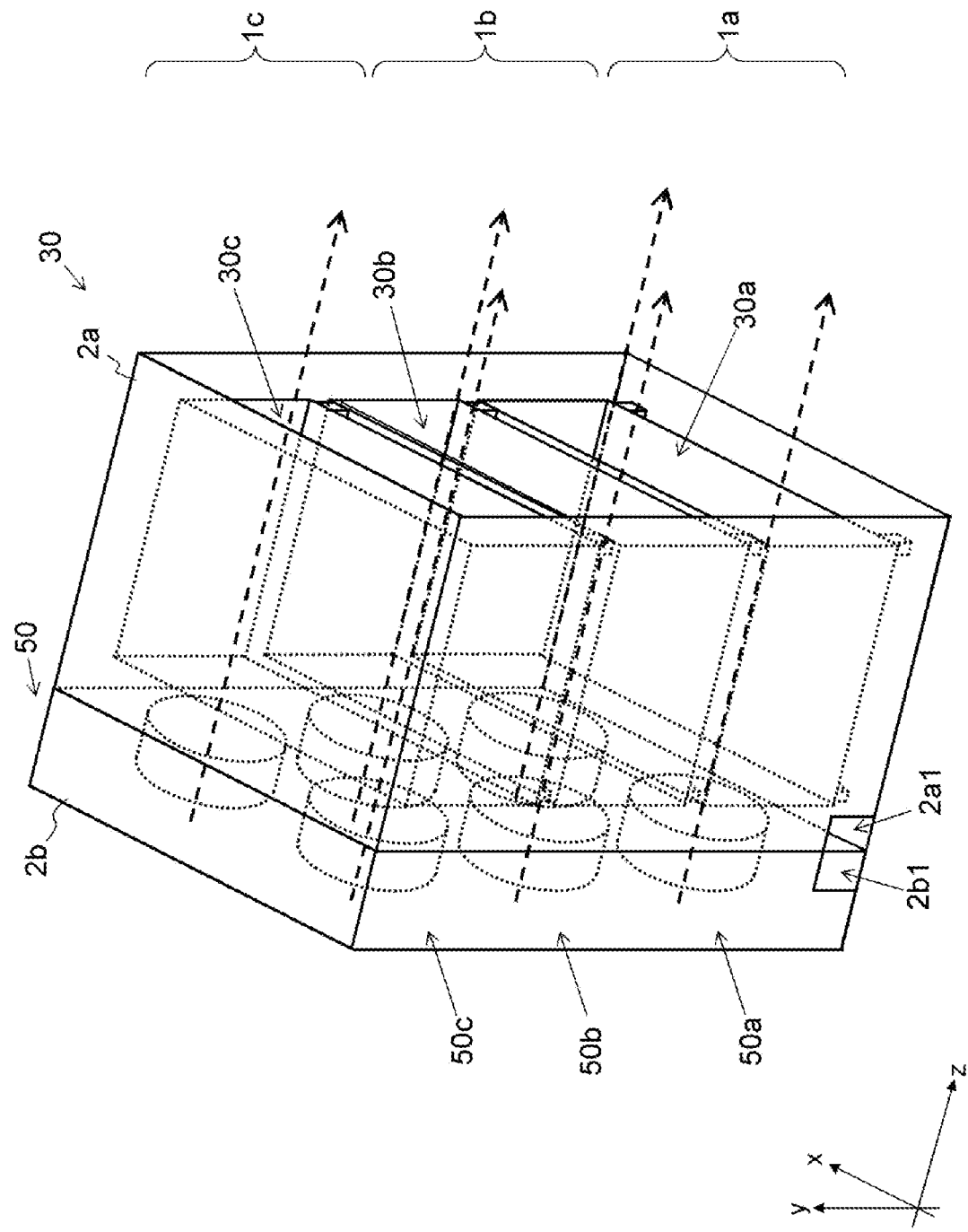
FIG. 2 is a perspective view of a region including a cooling part and a resistance unit.

FIG. 2 does not show the resistors but shows by dotted lines the contours of the first resistance unit 30a to the third resistance unit 30c and a first cooling device 53a to a sixth cooling device 53f which are not visible from the outside.

Figure 3:
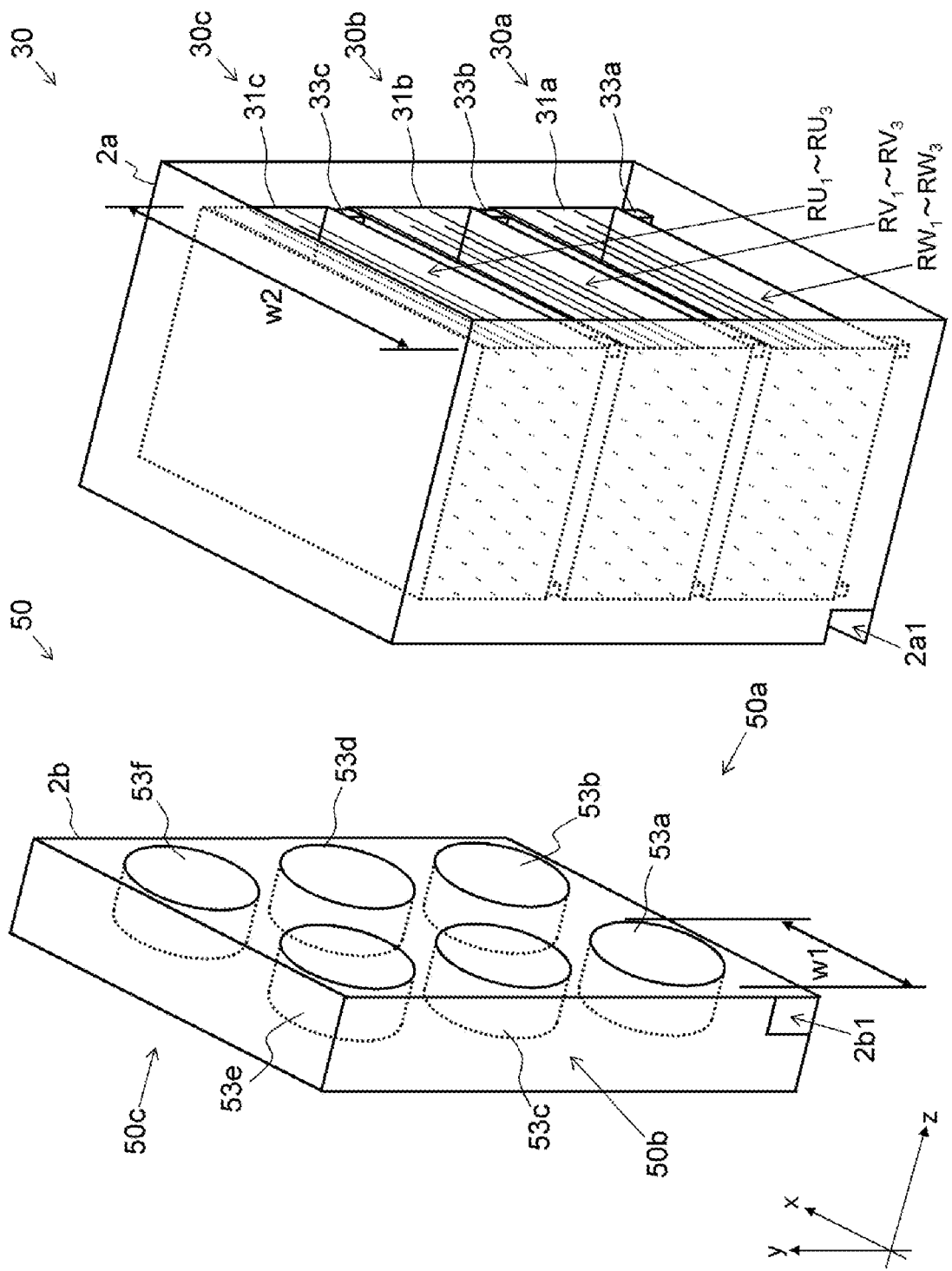
FIG. 3 is an exploded perspective view of a region including the cooling part and the resistance unit.

FIG. 3 does not show the portions of the resistors that are invisible from the outside except for the terminals on the relay part 90 side (regions protruding in the x direction from a first holding part 31a to a third holding part 31c) but shows by dotted lines the contours of the first resistance unit 30a to the third resistance unit 30c and the first cooling device 53a to the sixth cooling device 53f that are invisible from the outside.

Figure 4:
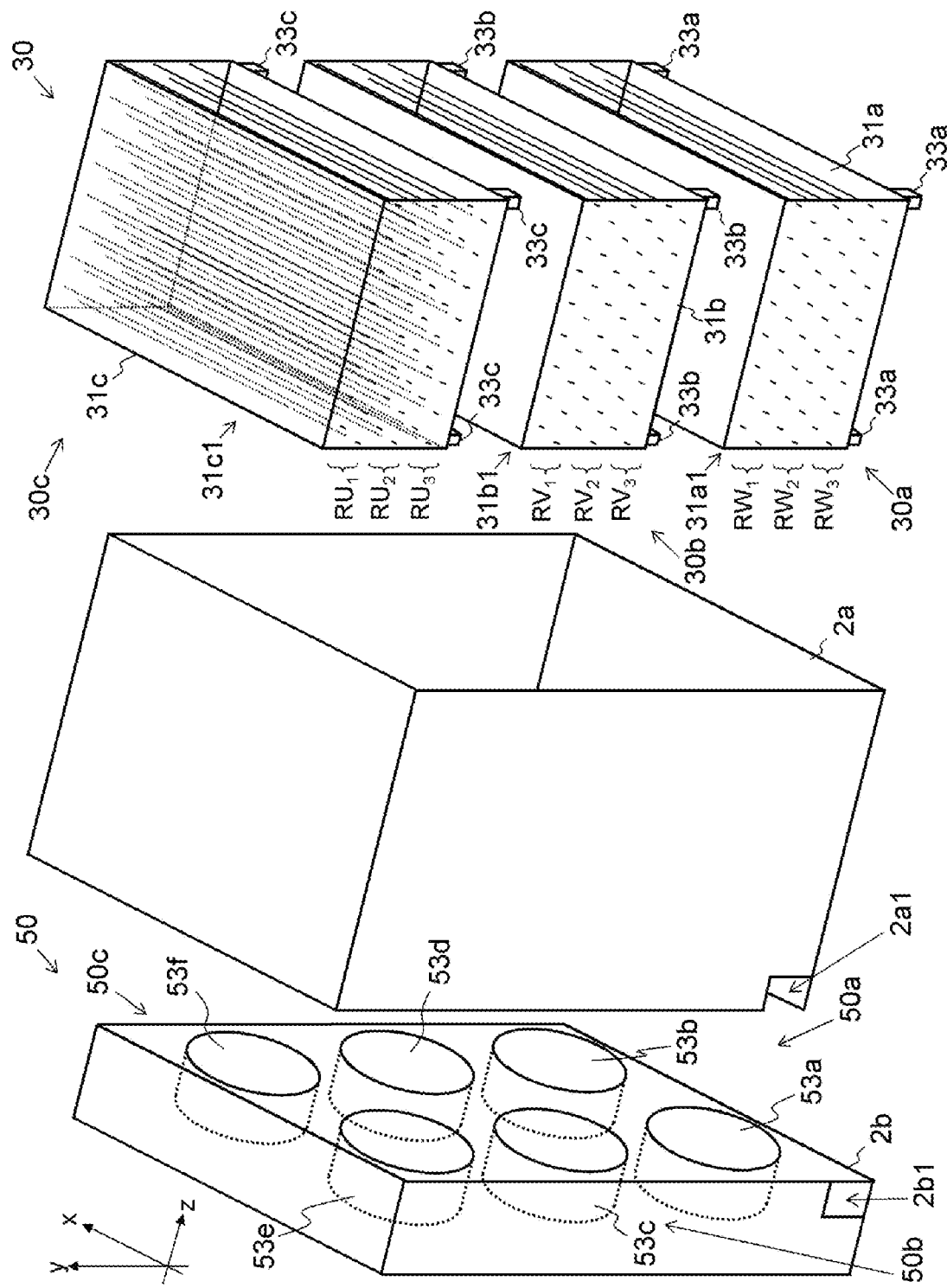
FIG. 4 is an exploded perspective view of a region including the cooling part, a first housing, a first resistance unit, a second resistance unit, and a third resistance unit.
Figure 9:
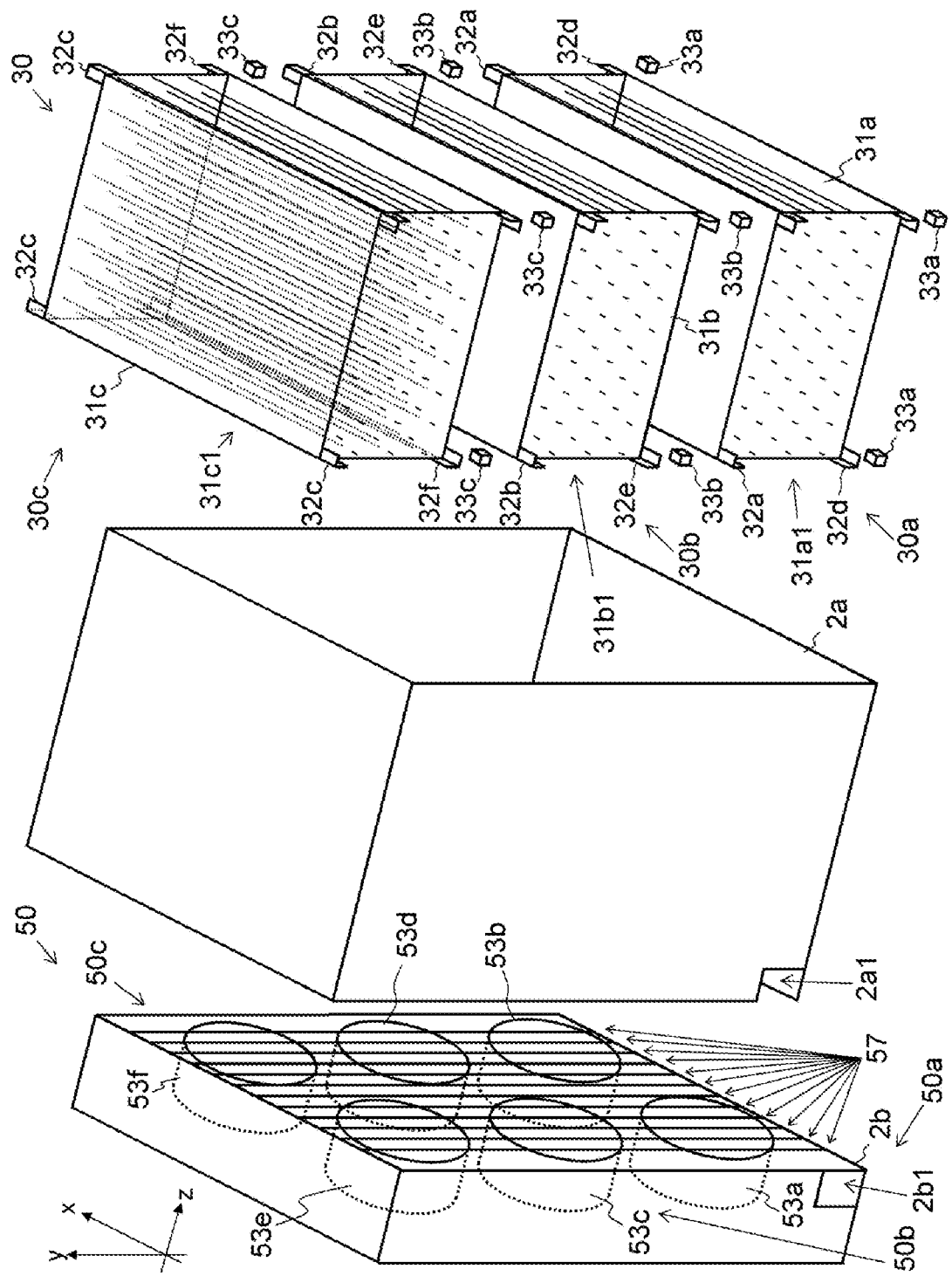
FIG. 9 is an exploded perspective view of a region including: the cooling part with a diffusion part; a first housing; the first resistance unit, the second resistance unit, and the third resistance unit that include projections; and insulators.

FIGS. 4 and 9 do not show the portions of the resistors in the first resistance unit 30a and the second resistance unit 30b that are invisible from the outside but show by dotted lines the portions of the resistors in the third resistance unit 30c that are invisible from the outside.

FIGS. 4 and 9 show by dotted lines the contours of the first cooling device 53a to the sixth cooling device 53f that are invisible from the outside.

FIGS. 3, 4, and 9 show the housing (the first housing 2a) of the first resistance unit 30a, the second resistance unit 30b, and the third resistance unit 30c and the housing (the second housing 2b) of the first cooling part 50a, the second cooling part 50b, and the third cooling part 50c in a separated state for making clear the positional relationship between the cooling part 50 and the resistance unit 30. However, after the assembly, the first housing 2a and the second housing 2b are fixed together as shown in FIGS. 1 and 2.

Alternatively, the first housing 2a and the second housing 2b may be integrally formed.

Figure 8:
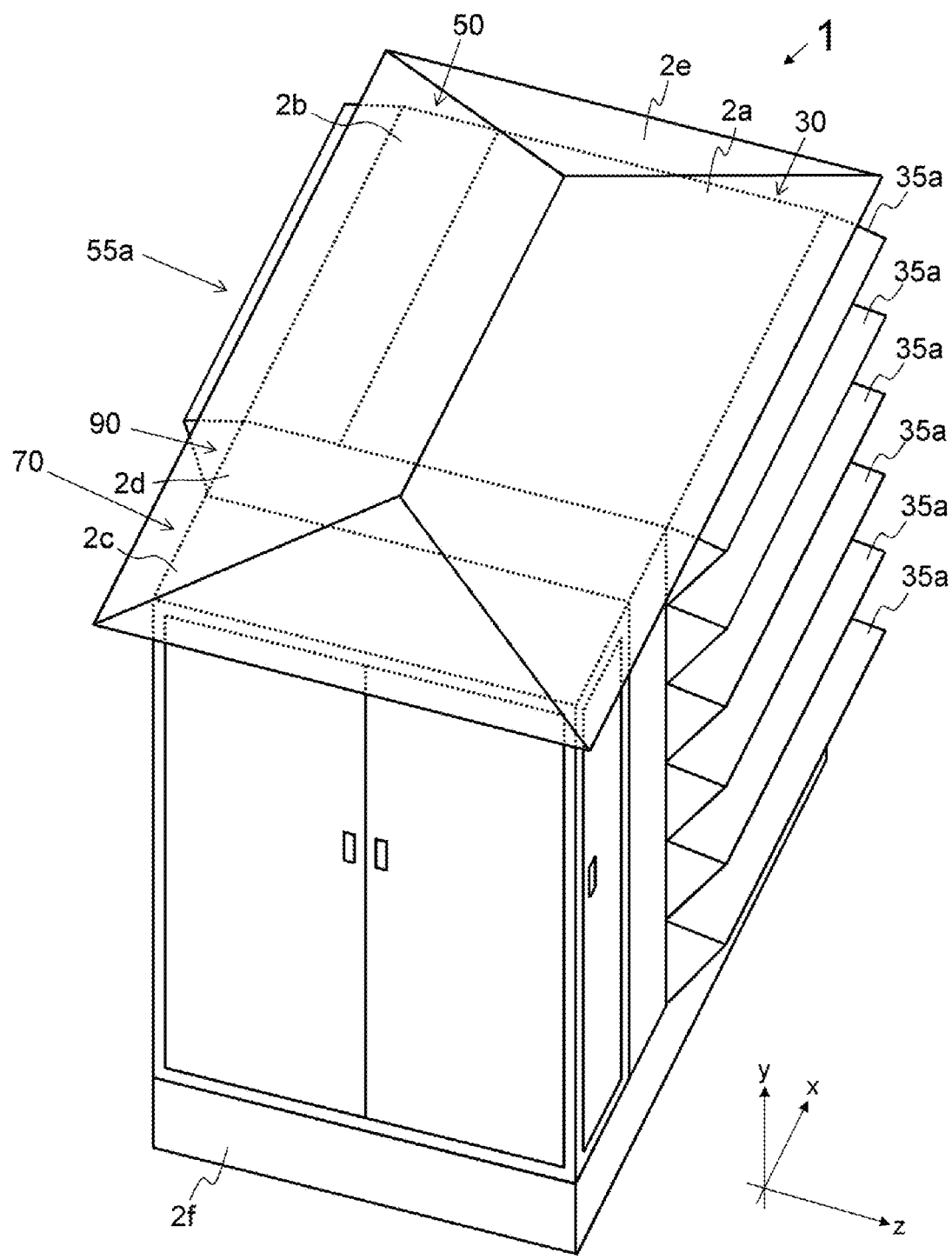
FIG. 8 is a perspective view of the load test apparatus provided with a roof part, a base part, the first exhaust port hoods, and the first intake port hoods.
Figure 13:
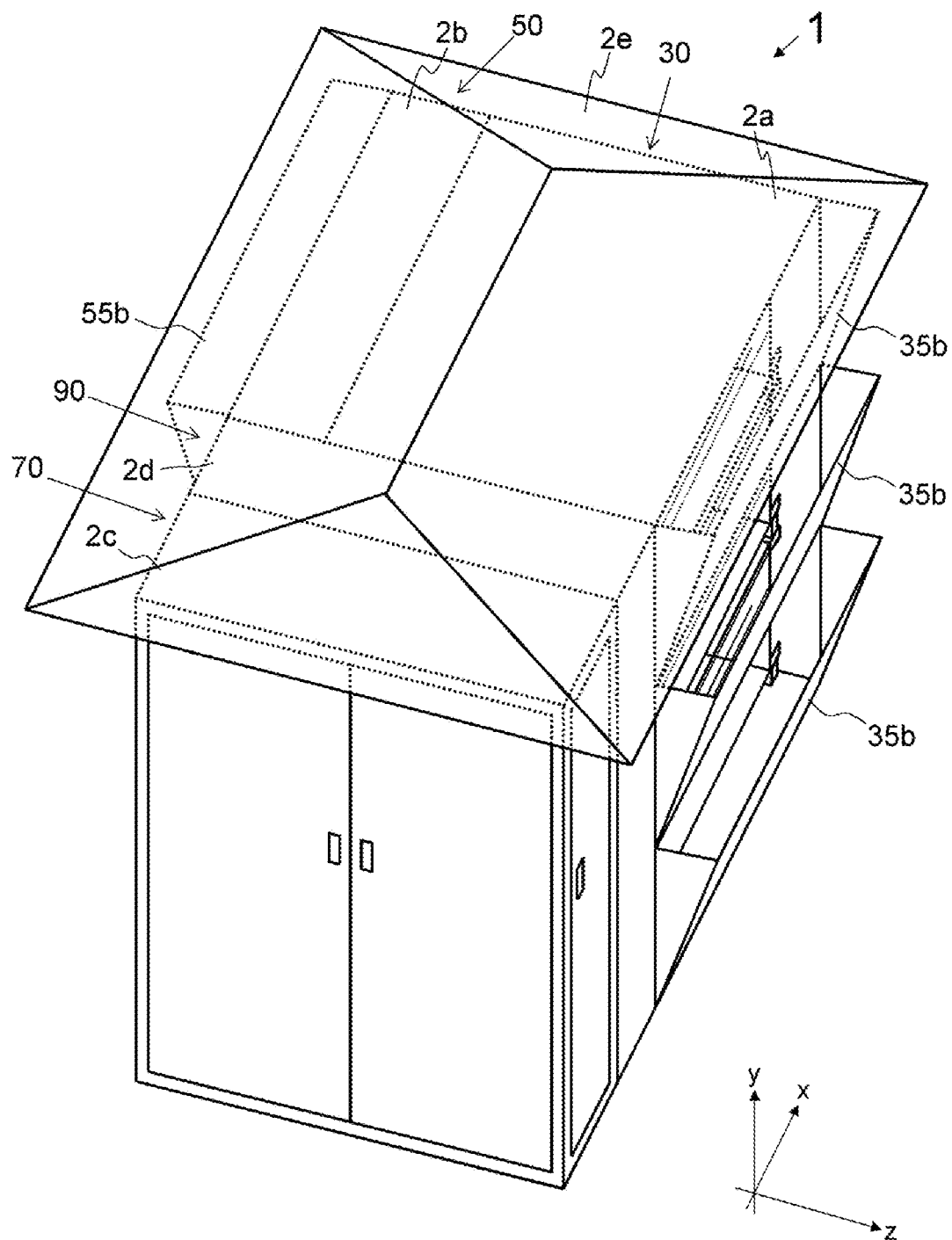
FIG. 13 is a perspective view of the load test apparatus provided with the roof part, the second exhaust port hoods, and the second intake port hoods.

FIGS. 8 and 13 show by dotted lines the contours of the first housing 2a and others that are hidden by a roof part 2e but do not show the other portions that are invisible from the outside.

FIGS. 10, 11, 18, 20, and 21 do not show the near side surface of the first housing 2a so that the internal structure can be seen through, and do not show the portions of the resistors that are invisible from the outside except for the terminals on the relay part 90 side (regions protruding in the x direction from the first holding part 31a to the third holding part 31c), but show by dotted lines the contours of the first resistance unit 30a to the third resistance unit 30c and the first cooling device 53a to the sixth cooling device 53f that are invisible from the outside.

Figure 19:
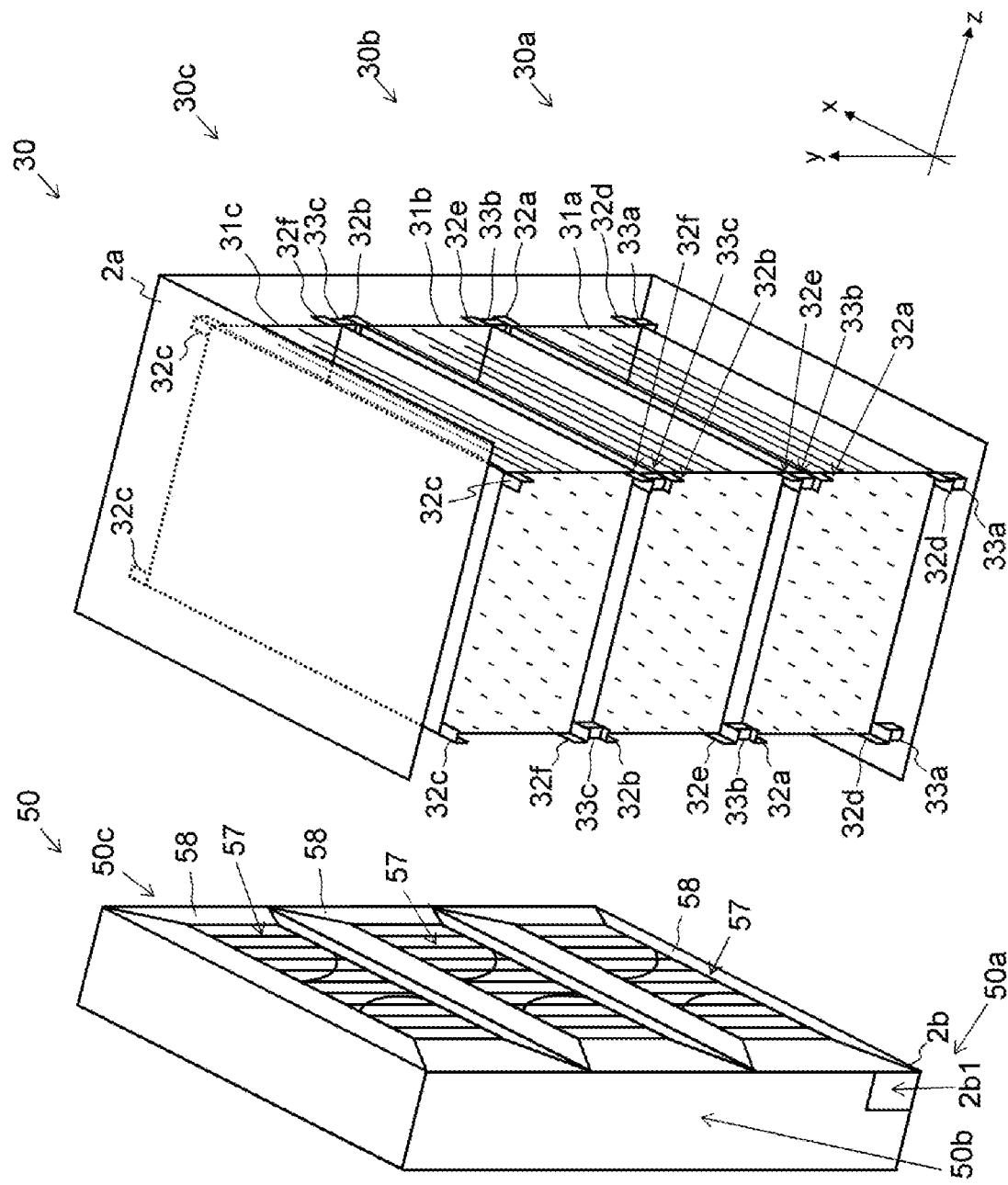
FIG. 19 is an exploded perspective view of a region including the cooling part including the constriction portions provided with the diffusion part and the resistance unit including the projections.

FIG. 19 does not show the near side surface of the first housing 2a so that the internal structure can be seen through, does not show the portions of the resistors that are invisible from the outside except for the terminals on the relay part 90 side (regions protruding in the x direction from the first holding part 31a to the third holding part 31c) but shows by dotted lines the first resistance unit 30a to the third resistance unit 30c and shows by solid lines the contours of the first cooling device 53a to the sixth cooling device 53f that are visible from the outside.

A configuration of the first load test part 1a will be described.

The first load test part 1a is used to perform a load test of one of the three phases of a power supply to be tested (three-phase alternating current generator) (in the present embodiment, T phase). The first load test part 1a has the first resistance unit 30a and the first cooling part 50a (a first cooling device 53a and a second cooling device 53b).

The first cooling part 50a and the first resistance unit 30a are arranged in the z direction such that an intake port of the first resistance unit 30a (a first opening 31a1 of the first holding part 31a) and an exhaust port of the first cooling part 50a (the first cooling device 53a and the second cooling device 53b) face each other.

A configuration of the second load test part 1b will be described.

The second load test part 1b is used to perform a load test of one of the three phases of a power supply to be tested (three-phase alternating current generator) (in the present embodiment, S phase). The second load test part 1b is placed on the first load test part 1a and has the second resistance unit 30b and the second cooling part 50b (a third cooling device 53c and a fourth cooling device 53d).

The second cooling part 50b and the second resistance unit 30b are arranged in the z direction such that an intake port of the second resistance unit 30b (a second opening 31b1 of a second holding part 31b) and an exhaust port of the second cooling part 50b (the third cooling device 53c and the fourth cooling device 53d) face each other.

A configuration of the third load test part 1c will be described.

The third load test part 1c is used to perform a load test of one of the three phases of a power supply to be tested (three-phase alternating current generator) (in the present embodiment, R phase). The third load test part 1c is placed on the second load test part 1b and has the third resistance unit 30c and the third cooling part 50c (the fifth cooling device 53e and the sixth cooling device 53f).

The third cooling part 50c and the third resistance unit 30c are arranged in the z direction such that an intake port of the third resistance unit 30c (a third opening 31c1 of a third holding part 31c) and an exhaust port of the third cooling part 50c (the fifth cooling device 53e and the sixth cooling device 53f) face each other.

Figure 5:
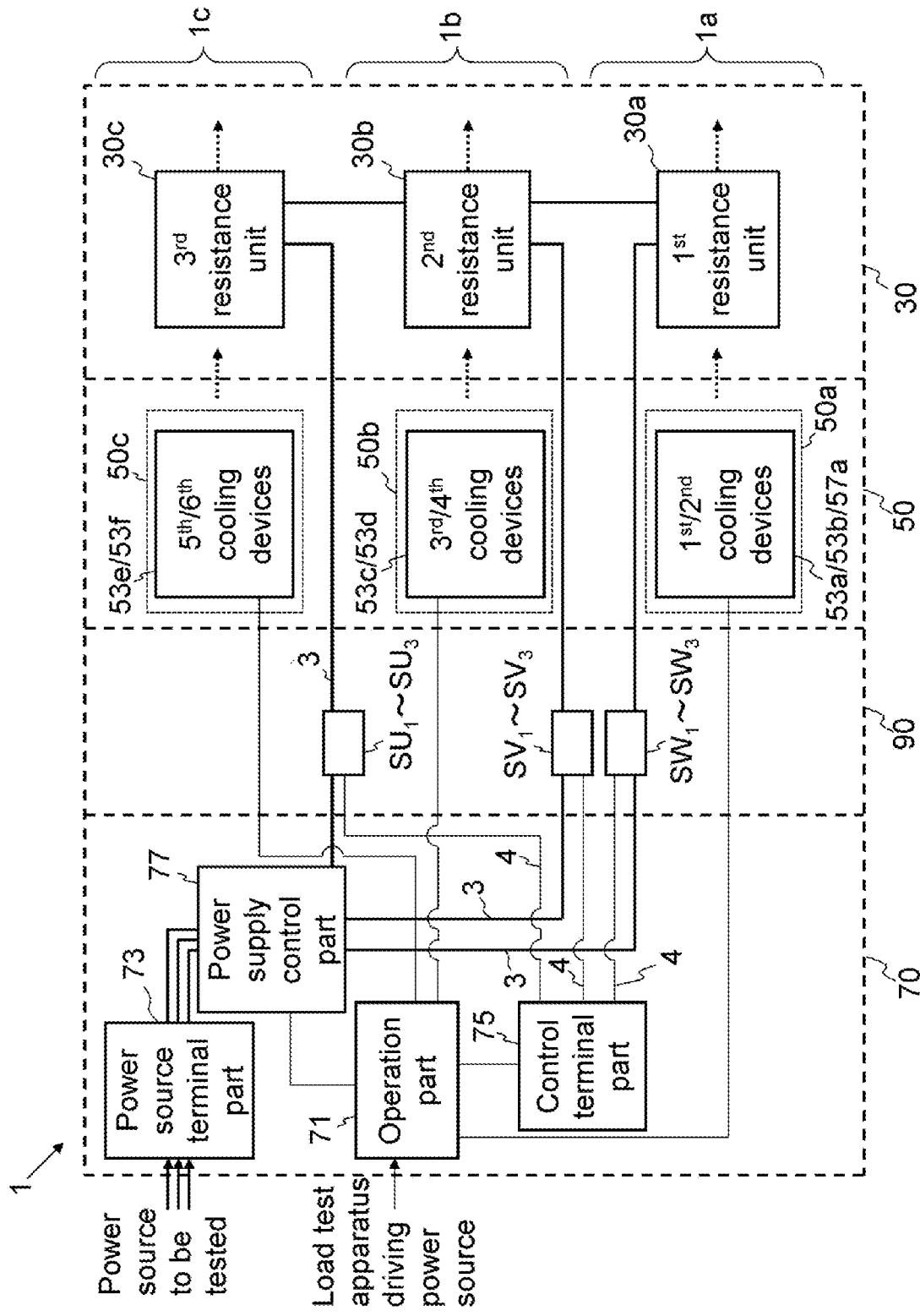
FIG. 5 is a schematic diagram showing a configuration of the load test apparatus.
Figure 6:
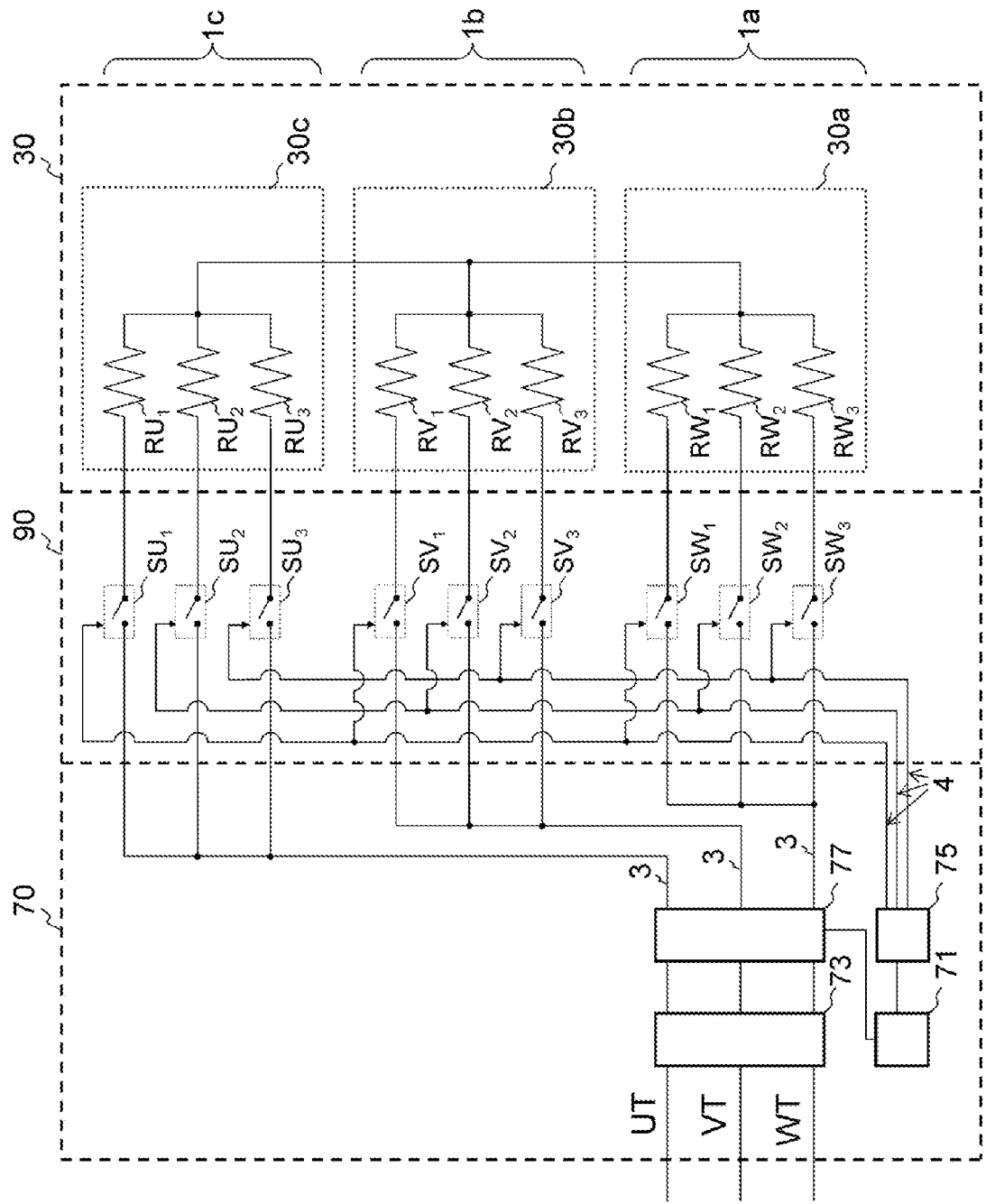
FIG. 6 is a diagram showing wiring of resistor groups and switching devices in the load test apparatus.

Resistor groups of the first resistance unit 30a (a first W-phase resistor group $RW_1$ to a third W-phase resistor group $RW_3$), resistor groups of the second resistance unit 30b (a first V-phase resistor group $RV_1$ to a third V-phase resistor group $RV_3$), and resistor groups of the third resistance unit 30c (a first U-phase resistor group $RU_1$ to a third U-phase resistor group $RU_3$) are electrically connected by the use of connection members 3 such as cables and connection bars from a power source terminal part 73 of the control part 70 (see FIGS. 5 and 6).

Switching devices of the first resistance unit 30a (a first W-phase switching device $SW_1$ to a third W-phase switching device $SW_3$), switching devices of the second resistance unit 30b (a first V-phase switching device $SV_1$ to a third V-phase switching device $SV_3$), and switching devices of the third resistance unit 30c (a first U-phase switching device $SU_1$ to a third U-phase switching device $SU_3$) are controlled by the use of cables (control lines 4) from a control terminal part 75 of the control part 70.

The control lines 4 are cables used for performing on/off control of the switching devices ($SU_1$ to $SU_3$, $SV_1$ to $SV_3$, $SW_1$ to $SW_3$) provided in the control part 70 to the relay part 90 (the control lines 4 are not shown in the perspective views of FIGS. 1 to 4 and 7 to 15).

A configuration of the first resistance unit 30a will be described.

The first resistance unit 30a has a plurality of resistors (first resistors), the first holding part 31a that holds the plurality of first resistors, and first insulators 33a.

The resistors of the first resistance unit 30a are held on the side surfaces of the first holding part 31a that is formed of a frame body with the front surface and rear surface opened.

The front opening in the first holding part 31a functions as an exhaust port, and the rear opening (the first opening 31a1 in the surface facing the first cooling part 50a) functions as an intake port.

The insulators (the first insulators 33a) are provided at four corners on the lower surface of the first holding part 31a.

The first holding part 31a is placed on the bottom surface of the first housing 2a with the first insulators 33a therebetween.

The plurality of resistors (the first resistors) included in the first resistance unit 30a include one or more resistor rows arranged in the y direction. Each said resistor row includes a plurality of rod-shaped resistors parallel to the x direction which is arranged at predetermined intervals in the z direction. The plurality of resistors are used to perform a T-phase load test of a power supply to be tested, such as a three-phase alternating-current generator, connected via the power source terminal part 73 of the control part 70.

Of the plurality of resistors (the first resistors) included in the first resistance unit 30a, one or more resistors connected in series or in parallel form resistor group(s). The resistor group is connected in parallel to another resistor group, and a switching device is provided for performing on/off control of power supply for each resistor group.

A load test is performed with changes in the number of resistor groups to which a voltage is applied from the T phase of the power supply to be tested.

In the present embodiment, the first resistance unit 30a has six resistor rows arranged in the y direction. Each resistor row includes eight rod-shaped resistors parallel to the x direction which are arranged at predetermined intervals in the z direction.

A resistor group including the upper two rows of 16 resistors constitutes the first W-phase resistor group $RW_1$. A resistor group including the middle two rows of 16 resistors constitutes the second W-phase resistor group $RW_2$. A resistor group including the lower two rows of 16 resistors constitutes the third W-phase resistor group $RW_3$.

The first W-phase switching device $SW_1$ is provided as a switching device that performs on/off control of power supply to the first W-phase resistor group $RW_1$. The second W-phase switching device $SW_2$ is provided as a switching device that performs on-off control of power supply to the second W-phase resistor group $RW_2$. The third W-phase switching device $SW_3$ is provided as a switching device that performs on/off control of power supply to the third W-phase resistor group $RW_3$.

The first W-phase switching device $SW_1$ to the third W-phase switching device $SW_3$ are housed in the relay part 90 and are connected to the control terminal part 75 of the control part 70 via the control lines 4 to perform on/off control in response to on/off operation on an operation part 71 of the control part 70.

A configuration of the second resistance unit 30b will be described.

The second resistance unit 30b includes a plurality of resistors (second resistors), the second holding part 31b that holds the plurality of second resistors, and second insulators 33b.

The resistors of the second resistance unit 30b are held on the side surfaces of the second holding part 31b that is formed of a frame body with the front surface and rear surface opened.

The front opening in the second holding part 31b functions as an exhaust port, and the rear opening (the second opening 31b1 in the surface facing the second cooling part 50b) functions as an intake port.

The insulators (the second insulators 33b) are provided at four corners on the lower surface of the second holding part 31b.

The second holding part 31b is placed on the upper surface of the first holding part 31a of the first resistance unit 30a with the second insulators 33b therebetween.

The plurality of resistors (the second resistors) included in the second resistance unit 30b include one or more resistor rows arranged in the y direction. Each said resistor row includes a plurality of rod-shaped resistors parallel to the x direction which is arranged at predetermined intervals in the z direction. The plurality of resistors are used to perform an S-phase load test of the power supply to be tested, such as the three-phase alternating-current generator, connected via the power source terminal part 73 of the control part 70.

Of the plurality of resistors (the second resistors) included in the second resistance unit 30b, one or more resistors connected in series or in parallel form resistor group(s). The resistor group is connected in parallel to another resistor group, and a switching device is provided for performing on/off control of power supply for each resistor group.

A load test is performed with changes in the number of resistor groups to which a voltage is applied from the S phase of the power supply to be tested.

In the present embodiment, the second resistance unit 30b has six resistor rows arranged in the y direction. Each resistor row includes eight rod-shaped resistors parallel to the x direction which are arranged at predetermined intervals in the z direction.

A resistor group including the upper two rows of 16 resistors constitutes the first V-phase resistor group $RV_1$. A resistor group including the middle two rows of 16 resistors constitutes the second V-phase resistor group $RV_2$. A resistor group including the lower two rows of 16 resistors constitutes the third V-phase resistor group $RV_3$.

The first V-phase switching device $SV_1$ is provided as a switching device that performs on/off control of power supply to the first V-phase resistor group $RV_1$. The second V-phase switching device $SV_2$ is provided as a switching device that performs on-off control of power supply to the second V-phase resistor group $RV_2$. The third V-phase switching device $SV_3$ is provided as a switching device that performs on/off control of power supply to the third V-phase resistor group $RV_3$.

The first V-phase switching device $SV_1$ to the third V-phase switching device $SV_3$ are housed in the relay part 90 and are connected to the control terminal part 75 of the control part 70 via the control lines 4 to perform on/off control in response to on/off operation on the operation part 71 of the control part 70.

A configuration of the third resistance unit 30c will be described.

The third resistance unit 30c includes a plurality of resistors (third resistors), the third holding part 31c that holds the plurality of third resistors, and third insulators 33c.

The resistors of the third resistance unit 30c are held on the side surfaces of the third holding part 31c that is formed of a frame body with the front surface and rear surface opened.

The front opening in the third holding part 31c functions as an exhaust port, and the rear opening (the third opening 31c1 in the surface facing the third cooling part 50c) functions as an intake port.

The insulators (the third insulators 33c) are provided at four corners on the lower surface of the third holding part 31c.

The third holding part 31c is placed on the upper surface of the second holding part 31b of the second resistance unit 30b with the third insulators 33c therebetween.

In the present embodiment, the first insulators 33a to the third insulators 33c are shown in a rectangular parallelepiped shape. However, the shape of the insulators is not limited to a rectangular parallelepiped shape but may be another shape such as a substantially cylindrical shape.

The plurality of resistors (the third resistors) included in the third resistance unit 30c include one or more resistor rows arranged in the y direction. Each said resistor row includes a plurality of rod-shaped resistors parallel to the x direction which is arranged at predetermined intervals in the z direction. The plurality of resistors are used to perform an R-phase load test of the power supply to be tested, such as the three-phase alternating-current generator, connected via the power source terminal part 73 of the control part 70.

Of the plurality of resistors (the third resistors) included in the third resistance unit 30c, one or more resistors connected in series or in parallel form resistor group(s). The resistor group is connected in parallel to another resistor group, and a switching device is provided for performing on/off control of power supply for each resistor group.

A load test is performed with changes in the number of resistor groups to which a voltage is applied from the R phase of the power supply to be tested.

In the present embodiment, the third resistance unit 30c has six resistor rows arranged in the y direction. Each resistor row includes eight rod-shaped resistors parallel to the x direction which are arranged at predetermined intervals in the z direction.

A resistor group including the upper two rows of 16 resistors constitutes the first U-phase resistor group $RU_1$. A resistor group including the middle two rows of 16 resistors constitutes the second U-phase resistor group $RU_2$. A resistor group including the lower two rows of 16 resistors constitutes the third U-phase resistor group $RU_3$.

The first U-phase switching device $SU_1$ is provided as a switching device that performs on/off control of power supply to the first U-phase resistor group $RU_1$. The second U-phase switching device $SU_2$ is provided as a switching device that performs on-off control of power supply to the second U-phase resistor group $RU_2$. The third U-phase switching device $SU_3$ is provided as a switching device that performs on/off control of power supply to the third U-phase resistor group $RU_3$.

The first U-phase switching device $SU_1$ to the third U-phase switching device $SU_3$ are housed in the relay part 90, are connected to the control terminal part 75 of the control part 70 via the control line 4, and turn on/off the operation part 71 of the control part 70. On/off control is performed according to the operation.

For neutral point connection, the first U-phase resistor group $RU_1$, the first V-phase resistor group $RV_1$, the first W-phase resistor group $RW_1$, the second U-phase resistor group $RU_2$, the second V-phase resistor group $RV_2$, the second W-phase resistor group $RW_2$, the third U-phase resistor group $RU_3$, the third V-phase resistor group $RV_3$, and the third W-phase resistor group $RW_3$ are short-circuited.

In the present embodiment, as an example, the first resistance unit 30a to the third resistance unit 30c respectively includes three resistor groups ($RW_1$ to $RW_3$, $RV_1$ to $RV_3$, and $RU_1$ to $RU_3$) and three switching devices ($SW_1$ to $SW_3$, $SV_1$ to $SV_3$, $SU_1$ to $SU_3$) that perform on/off control of power supply to the resistor groups. However, the numbers of the resistor groups and switching devices are not limited to three.

In the rows of resistors in the first resistance unit 30a to the third resistance unit 30c, a plurality of rod-shaped resistors parallel to the x direction are arranged at predetermined intervals in the y direction. Alternatively, a plurality of rod-shaped resistors parallel to the y direction may be arranged at predetermined intervals in the x direction.

A configuration of the first cooling part 50a will be described.

The first cooling part 50a has the first cooling device 53a and the second cooling device 53b.

The front surface of the first cooling part 50a (the surface facing the first opening 31a1 in the first holding part 31a of the first resistance unit 30a) opens as an exhaust port, and the rear surface of the same opens as an intake port.

The first cooling device 53a and the second cooling device 53b discharge air (see the dashed arrow in FIG. 2) in the horizontal direction (the z direction) such as a cooling fan, and send the air introduced from the intake port into the first resistance unit 30a through the exhaust port.

The first cooling device 53a and the second cooling device 53b are arranged side by side in the x direction.

The first cooling device 53a cools a region of the resistors in the first resistance unit 30a on the side close to the relay part 90.

The second cooling device 53b cools a region of the resistors in the first resistance unit 30a on the side distant from the relay part 90.

To expose almost the entire first opening 31a1 in the first holding part 31a of the first resistance unit 30a to cooling air from the plurality of cooling devices in the first cooling part 50a, the respective dimensions of the members are desirably determined such that a width w1 in the x direction of a region where cooling air is discharged (diameter of said region) in each of two or more cooling devices (the first cooling device 53a and the second cooling device 53b) of the first cooling part 50a is shorter than ⅔ of a width w2 in the x direction of a region covered with the first holding part 31a in the resistors of the first resistance unit 30a (see FIG. 3, w1<w2×⅔).

A configuration of the second cooling part 50b will be described.

The second cooling part 50b has the third cooling device 53c and the fourth cooling device 53d.

The front surface of the second cooling part 50b (the surface facing the second opening 31b1 in the second holding part 31b of the second resistance unit 30b) opens as an exhaust port, and the rear surface of the same opens as an intake port.

The third cooling device 53c and the fourth cooling device 53d discharge air (see the dashed arrow in FIG. 2) in the horizontal direction (the z direction) such as a cooling fan, and send the air introduced from the intake port into the second resistance unit 30b through the exhaust port.

The third cooling device 53c and the fourth cooling device 53d are arranged side by side in the x direction.

The third cooling device 53c cools a region of the resistors in the second resistance unit 30b on the side close to the relay part 90.

The fourth cooling device 53d cools a region of the resistors in the second resistance unit 30b on the side distant from the relay part 90.

To expose almost the entire second opening 31b1 in the second holding part 31b of the second resistance unit 30b to cooling air from the plurality of cooling devices in the second cooling part 50b, the respective dimensions of the members are desirably determined such that a width w1 in the x direction of a region where cooling air is discharged (diameter of said region) in each of two or more cooling devices (the third cooling device 53c and the fourth cooling device 53d) of the second cooling part 50b is shorter than ⅔ of a width w2 in the x direction of a region covered with the second holding part 31b in the resistors of the second resistance unit 30b (w1<w2×⅔).

The second cooling part 50b is provided on the first cooling part 50a.

A configuration of the third cooling part 50c will be described.

The third cooling part 50c has the fifth cooling device 53e and the sixth cooling device 53f.

The front surface of the third cooling part 50c (the surface facing the third opening 31c1 in the third holding part 31c of the third resistance unit 30c) opens as an exhaust port, and the rear surface of the same opens as an intake port.

The fifth cooling device 53e and the sixth cooling device 53f discharge air (see the dashed arrow in FIG. 2) in the horizontal direction (the z direction) such as a cooling fan, and send the air introduced from the intake port into the third resistance unit 30c through the exhaust port.

The fifth cooling device 53e and the sixth cooling device 53f are arranged side by side in the x direction.

The fifth cooling device 53e cools a region of the resistors in the third resistance unit 30c on the side close to the relay part 90.

The sixth cooling device 53f cools a region of the resistors in the third resistance unit 30c on the side distant from the relay part 90.

To expose almost the entire third opening 31c1 in the third holding part 31c of the third resistance unit 30c to cooling air from the plurality of cooling devices in the third cooling part 50c, the respective dimensions of the members are desirably determined such that a width w1 in the x direction of a region where cooling air is discharged (diameter of said region) in each of two or more cooling devices (the fifth cooling device 53e and the sixth cooling device 53f) of the third cooling part 50c is shorter than ⅔ of a width w2 in the x direction of a region covered with the third holding part 31c in the resistors of the third resistance unit 30c (w1<w2×⅔).

The third cooling part 50c is provided on the second cooling part 50b.

The first cooling device 53a to the sixth cooling device 53f may be attached to a housing (the second housing 2b)

covering the first cooling device 53a to the sixth cooling device 53f, or may be attached to the first housing 2a.

A configuration of the control part 70 will be described.

The control part 70 includes the third housing 2c, the operation part 71, the power source terminal part 73, the control terminal part 75, and a power supply control part 77.

The operation part 71, the power source terminal part 73, the control terminal part 75, and the power supply control part 77 are housed in the third housing 2c (the housing of the control part 70).

The third housing 2c covers the operation part 71, the power source terminal part 73, the control terminal part 75, and the power supply control part 77.

The switching devices ($SW_1$ to $SW_3$, $SV_1$ to $SV_3$, and $SU_1$ to $SU_3$) of the first resistance unit 30a to the third resistance unit 30c, the first cooling device 53a to the fifth cooling device 53e, and the power supply control part 77 are driven by a power source (power source for driving a load test apparatus) different from the power source to be tested (see FIG. 5).

The operations of the operation part 71, the cable connection between the operation part 71 and the power supply for driving a load test apparatus, and the cable connection between the power source terminal part 73 and the power source to be tested are performed in a state where a door provided in the third housing 2c is opened.

The operation part 71 has a mode switch MS, a fan switch FS, and first to third operation switches S1 to S3 (not shown).

The mode switch MS is a rotary-type or slide-type (or toggle-type or push button-type) operation switch, which is used to select on/off of the load test apparatus 1. Further, the mode switch MS may also be used for selecting the type or the like of the power source to be tested (mode switching).

When performing a load test, the mode switch MS is operated to an ON operation position. To turn off the load test apparatus 1, the mode switch MS is operated to an off operation position.

The fan switch FS is a slide-type (or toggle-type or push button-type) operation switch to perform on/off control of the first cooling device 53a to the sixth cooling device 53f when the mode switch MS is in the on state. In the case that the fan switch FS is omitted, when the mode switch MS is operated to the ON operation position, the first cooling device 53a to the sixth cooling device 53f may be operated.

The first to third operation switches S1 to S3 are slide-type (or toggle-type or push button-type) operation switches. These switches are for performing on/off control of the switching devices (the first W-phase switching device $SW_1$ to the third W-phase switching device $SW_3$) in the resistor groups (the first W-phase resistor group $RW_1$ to the third W-phase resistor group $RW_3$) of the first resistance unit 30a, the switching devices (the first V-phase switching device $SV_1$ to the third V-phase switching device $SV_3$) in the resistor groups (the first V-phase resistor group $RV_1$ to the third V-phase resistor group $RV_3$) of the second resistance unit 30b, and the switching devices (the first U-phase switching device $SU_1$ to the third U-phase switching device $SU_3$) in the resistor groups (the first U-phase resistor group $RU_1$ to the third U-phase resistor group $RU_3$) of the third resistance unit 30c.

When the mode switch MS is in the on state and the first operation switch S1 is set to the on state, the first W-phase switching device $SW_1$, the first V-phase switching device $SV_1$, and the first U-phase switching device $SU_1$ are set to the on state (conducting state). Accordingly, electric current can flow from the T phase of the power source to be tested that is connected to the load test apparatus 1 into the first W-phase resistor group $RW_1$ via a W-phase terminal WT, electric current can flow from the S-phase of the power source to be tested that is connected to the load test apparatus 1 into the first V-phase resistor group $RV_1$ via a V-phase terminal VT, and electric current can flow from the R phase of the power source to be tested that is connected to the load test apparatus 1 into the first U-phase resistor group $RU_1$ via a U-phase terminal UT.

The same applies to the second operation switch S2 and the third operation switch S3. When the mode switch MS is in the on and the second operation switch S2 or the third operation switch S3 is set to the on state, the switching devices of the corresponding resistor groups are set to the on state (conducting state). Accordingly, electric current can flow from the power source to be tested that is connected to the load test apparatus 1 into said resistor groups via the W-phase terminal WT, the V-phase terminal VT, and the U-phase terminal UT.

When the mode switch MS is operated to the ON operation position and the fan switch FS is operated to the ON operation position, the first cooling device 53a to the sixth cooling device 53f are driven, and on/off control of the switching devices in the resistor groups of the first resistance unit 30a to the third resistance unit 30c is performed based on the operation states of the first operation switch S1 to the third operation switch S3.

The power source terminal part 73 is a terminal for connecting the power source to be tested, and has the U-phase terminal UT, the V-phase terminal VT, and the W-phase terminal WT used for connection with the three-phase alternating-current generator.

At the load test of the three-phase alternating-current generator, the cables from the R, S, and T phases of the three-phase alternating-current generator are connected to the U-phase terminal UT, the V-phase terminal VT, and the W-phase terminal WT, respectively.

The control terminal part 75 has terminals for connection of the control lines 4 connecting with the switching devices of the relay part 90 (the first W-phase switching device $SW_1$ to the third W-phase switching device $SW_3$, the first V-phase switching device $SV_1$ to the third V-phase switching device $SV_3$, and the first U-phase switching device $SU_1$ to the third U-phase switching device $SU_3$).

When the control terminal part 75 is connected via the control lines 4 to the switching devices of the relay part 90 (the first W-phase switching device $SW_1$ to the third W-phase switching device $SW_3$, the first V-phase switching device $SV_1$ to the third V-phase switching device $SV_3$, and the first U-phase switching device $SU_1$ to the third U-phase switching device $SU_3$), on/off control of the first W-phase switching device $SW_1$ to the third W-phase switching device $SW_3$, the first V-phase switching device $SV_1$ to the third V-phase switching device $SV_3$, and the first U-phase switching device $SU_1$ to the third U-phase switching device $SU_3$ is performed according to the on/off state of the first operation switch S1 to the third operation switch S3.

For example, when the mode switch MS and the fan switch FS are operated to the on operation position, when the second operation switch S2 is set to the on state, and when the first operation switch S1 and the third operation switch S3 are set to the off state, the second W-phase switching device $SW_2$, the second V-phase switching device $SV_2$, and the second U-phase switching device $SU_2$ are set to the on state, and the other switching devices are set to the off state.

At this time, if the cables from the R, S, and T phases of the three-phase alternating-current generator are respectively connected to the U-phase terminal UT, the V-phase terminal VT, and the W-phase terminal WT, electric current can flow from the R phase of the three-phase alternating-current generator into the resistors in the second U-phase resistor group $RU_2$, electric current can flow from the S phase of the three-phase alternating-current generator into the resistors in the second V-phase resistor group $RV_2$, and electric current can flow from the T phase of the three-phase alternating-current generator into the resistors in the second W-phase resistor group $RW_2$.

The power supply control part 77 is a device such as a vacuum circuit breaker that controls the power supply from the power source to be tested to the first resistance unit 30a to the third resistance unit 30c according to the on/off state of the mode switch MS and the fan switch FS (the power supply control part 77 shuts off power supply when at least one of the mode switch MS and the fan switch FS is off).

Specifically, the power supply control part 77 is arranged in a line extending from the U-phase terminal UT to the resistors in the first U-phase resistor group $RU_1$ to the third U-phase resistor group $RU_3$, a line extending from the V-phase terminal VT to the resistors in the first V-phase resistor group $RV_1$ to the third V-phase resistor group $RV_3$, and a line extending from the W-phase terminal WT to the resistors in the first W-phase resistor group $RW_1$ to the third W-phase resistor group $RW_3$. When at least one of the mode switch MS and the fan switch FS is in the off state, the power supply control part 77 cuts off these three lines via relays (not shown).

A configuration of the relay part 90 will be described. The relay part 90 has the fourth housing 2d, the first W-phase switching device $SW_1$ to the third W-phase switching device $SW_3$, the first V-phase switching device $SV_1$ to the third V-phase switching device $SV_3$, and the first U-phase switching device $SU_1$ to the third U-phase switching device $SU_3$.

The fourth housing 2d covers the first W-phase switching device $SW_1$ to the third W-phase switching device $SW_3$, the first V-phase switching device $SV_1$ to the third V-phase switching device $SV_3$, and the first U-phase switching device $SU_1$ to the third U-phase switching device $SU_3$.

In the present embodiment, the first U-phase switching device $SU_1$ is disposed between the power supply control part 77 and the first U-phase resistor group $RU_1$, the second U-phase switching device $SU_2$ is disposed between the power supply control part 77 and the second U-phase resistor group $RU_2$, and the third U-phase switching device $SU_3$ is disposed between the power supply control part 77 and the third U-phase resistor group $RU_3$ (see FIG. 6).

The first V-phase switching device $SV_1$ is disposed between the power supply control part 77 and the first V-phase resistor group $RV_1$, the second V-phase switching device $SV_2$ is disposed between the power supply control part 77 and the second V-phase resistor group $RV_2$, and the third V-phase switching device $SV_3$ is disposed between the power supply control part 77 and the third V-phase resistor group $RV_3$.

The first W-phase switching device $SW_1$ is disposed between the power supply control part 77 and the first W-phase resistor group $RW_1$, the second W-phase switching device $SW_2$ is disposed between the power supply control part 77 and the second W-phase resistor group $RW_2$, and the third W-phase switching device $SW_3$ is disposed between the power supply control part 77 and the third W-phase resistor group $RW_3$.

Alternatively, each of the switching devices may be arranged between a short-circuit point of a resistor group and the resistor group.

For example, the first U-phase switching device $SU_1$ may be disposed between a point where the first U-phase resistor group $RU_1$, the first V-phase resistor group $RV_1$, and the first W-phase resistor group $RW_1$ are short-circuited and the first U-phase resistor group $RU_1$.

The fourth housing 2d is open on sides viewed from the x direction, and electrical members included in the resistance unit 30, the cooling part 50, the control part 70, and the relay part 90 are connected by cables through the opened area.

For this reason, the first housing 2a has at least a first opening 2a1 for letting a cable pass on the side in contact with the fourth housing 2d.

The second housing 2b has at least a second opening 2b1 for letting a cable pass on the side in contact with the fourth housing 2d.

The third housing 2c has at least an opening for letting cables pass on the side in contact with the fourth housing 2d.

The fourth housing 2d houses the switching devices (the first W-phase switching device $SW_1$ to the third W-phase switching device $SW_3$, the first V-phase switching device $SV_1$ to the third V-phase switching device $SV_3$, and the first U-phase switching device $SU_1$ to the third U-phase switching device $SU_3$).

In the present embodiment, a plurality of cooling devices for cooling one resistance unit (for sending cooling air to the opening of one resistance unit) is provided.

This makes it possible to use cooling devices smaller in size and rated capacity than those in a mode in which one cooling device cools one resistance unit.

Even if a plurality of cooling devices is used, the cooling devices can be made small in size and rated capacity, thereby making it possible to reduce noise from the cooling devices as compared to a mode in which a single large-sized cooling device is used.

In addition, since cooling air can be directly applied to many regions of the resistor groups, it is possible to suppress a rise in the temperature of the resistor groups as compared to the mode in which one cooling device cools one resistance unit.

Further, since small-sized cooling devices can be used, it is possible to suppress the dimension in the thickness direction (axial direction of the cooling fan), thereby contributing to the miniaturization of the load test apparatus 1

In particular, when a plurality of cooling devices is arranged in the direction in which the resistors extend (the x direction), it is possible to form a resistance unit using resistors long in the x direction.

In the present embodiment, a plurality of cooling devices for cooling one resistance unit is arranged in the direction in which the resistors extend (the x direction). However, if the resistance unit is long in the vertical direction (the y direction), the plurality of cooling devices may be arranged in the direction in which the resistors are arranged (the y direction).

The plurality of cooling devices may be arranged not only in one of the direction in which the resistors extend (the x direction) and the direction in which the resistors are arranged (the y direction), but also in both of these directions.

Specifically, the total 4×3=12 cooling devices, 4 in the x direction and 3 in the y direction, can be arranged so as to face the opening in one holding part of the resistance unit, as an example.

In the present embodiment, the cooling devices discharge cooling air in the horizontal direction. Alternatively, the cooling devices may discharge cooling air in the vertical direction.

In this case, the resistance unit to be cooled is arranged above the cooling part including a plurality of cooling devices.

Figure 7:
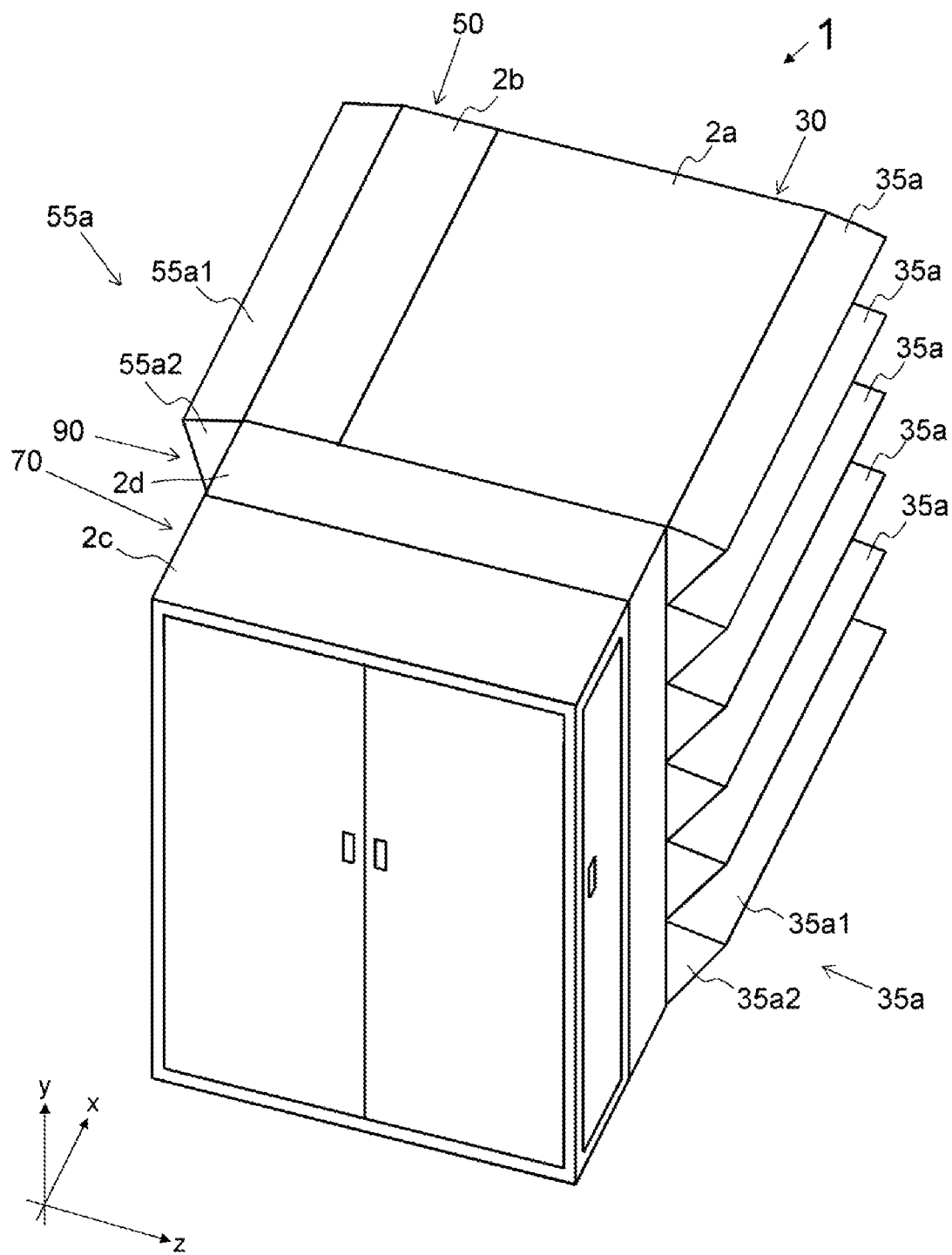
FIG. 7 is a perspective view of the load test apparatus provided with first exhaust port hoods and first intake port hoods.

First exhaust port hoods 35a may be provided at the exhaust port of the resistance unit 30, and first intake port hoods 55a may be provided at the intake port of the cooling part 50 (see FIG. 7).

The first exhaust port hoods 35a each have a first upper surface portion 35a1 and a first side surface portion 35a2.

The first exhaust port hoods 35a protrude in the z direction from the exhaust port of the resistance unit 30 and open downward or obliquely downward.

The first intake port hoods 55a each have a second upper surface portion 55a1 and a second side surface portion 55a2.

The first intake port hoods 55a protrude in the z direction from the intake port of the cooling part 50 and open downward or obliquely downward.

The cooling part 50 sucks air from downward or obliquely downward through the first intake port hoods 55a, and the sucked air is discharged downward or obliquely downward through the resistance unit 30 and the first exhaust port hoods 35a.

The first exhaust port hoods 35a may be constantly kept in a state of protruding in the z direction from the resistance unit 30. However, the first exhaust port hoods 35a may be configured such that the first upper surface portions 35a1 and the first side surface portions 35a2 are stored in the resistance unit 30 or at least part of the first upper surface portions 35a1 and the first side surface portions 35a2 are folded during the non-use period.

In this case, the first exhaust port hoods 35a can be kept from protruding in the z direction from the resistance unit 30 during the non-use period.

The opening and closing of the first exhaust port hoods 35a may be performed manually or may be performed electrically via an actuator (not shown).

The first exhaust port hoods 35a may be biased to be in a closed state, and may be opened by cooling air from the cooling part 50.

In this case, the first exhaust port hoods 35a can be automatically opened and closed without using electric energy.

The first intake port hoods 55a may be constantly kept in a state of protruding in the z direction from the cooling part 50. However, the first intake port hoods 55a may be configured such that the second upper surface portions 55a1 and the second side surface portions 55a2 are stored in the cooling part 50 or at least part of the second upper surface portions 55a1 and the second side surface portions 55a2 are folded during the non-use period.

In this case, the first intake port hoods 55a can be kept from protruding in the z direction from the cooling part 50 during the non-use period.

The opening and closing of the first intake port hoods 55a may be performed manually or may be performed electrically via an actuator (not shown).

The roof part 2e may be provided to cover the upper parts of the first housing 2a to the fourth housing 2d (see FIG. 8).

The roof part 2e has slopes on the upper part as seen in a hipped roof.

Thus, even when the load test apparatus 1 is installed outdoors, it is possible to prevent the upper parts of the first to fourth housings 2a to 2d from being directly hit by rain or snow. In addition, even when snow accumulates on the roof part 2e, the snow can be easily dropped off by using the slope.

Further, a base part 2f may be provided on the lower parts of the first to fourth housings 2a to 2d for supporting these housings.

The electric components included in the first to fourth housings 2a to 2d are arranged at positions higher by the height of the base part 2f.

For this reason, even when the load test apparatus 1 is installed outdoors and snow piles up around the load test apparatus 1, it is possible to reduce the possibility that snow or melted water comes into contact with the electrical components constituting the load test apparatus 1.

Further, a diffusion part 57 is provided between the cooling devices (the first cooling device 53a to the sixth cooling device 53f) of the cooling part 50 and the resistance unit 30 (the first resistance unit 30a to the third resistance unit 30c).

The diffusion part 57 diffuses cooling air to the resistance units from the first cooling device 53a to the sixth cooling device 53f in the xy directions (especially the x direction). The diffusion part 57 is formed of, for example, rod-shaped members extending in the y direction (see FIGS. 9 and 10).

In the present embodiment, the diffusion part 57 includes twelve rod-shaped members extending in the y direction. However, the number of rod-shaped members is not limited to twelve.

The diffusion part 57 may be provided separately for each of the cooling devices.

However, the diffusion part 57 may be formed in a substantially V-shape or the like in which the xz cross section is sharpened on the cooling part 50 side.

Providing the diffusion part 57 between the cooling part 50 and the resistance unit 30 makes it possible to diffuse cooling air in the x direction or the like so that cooling air can be substantially uniformly exposed to entire the resistors.

Figure 11:
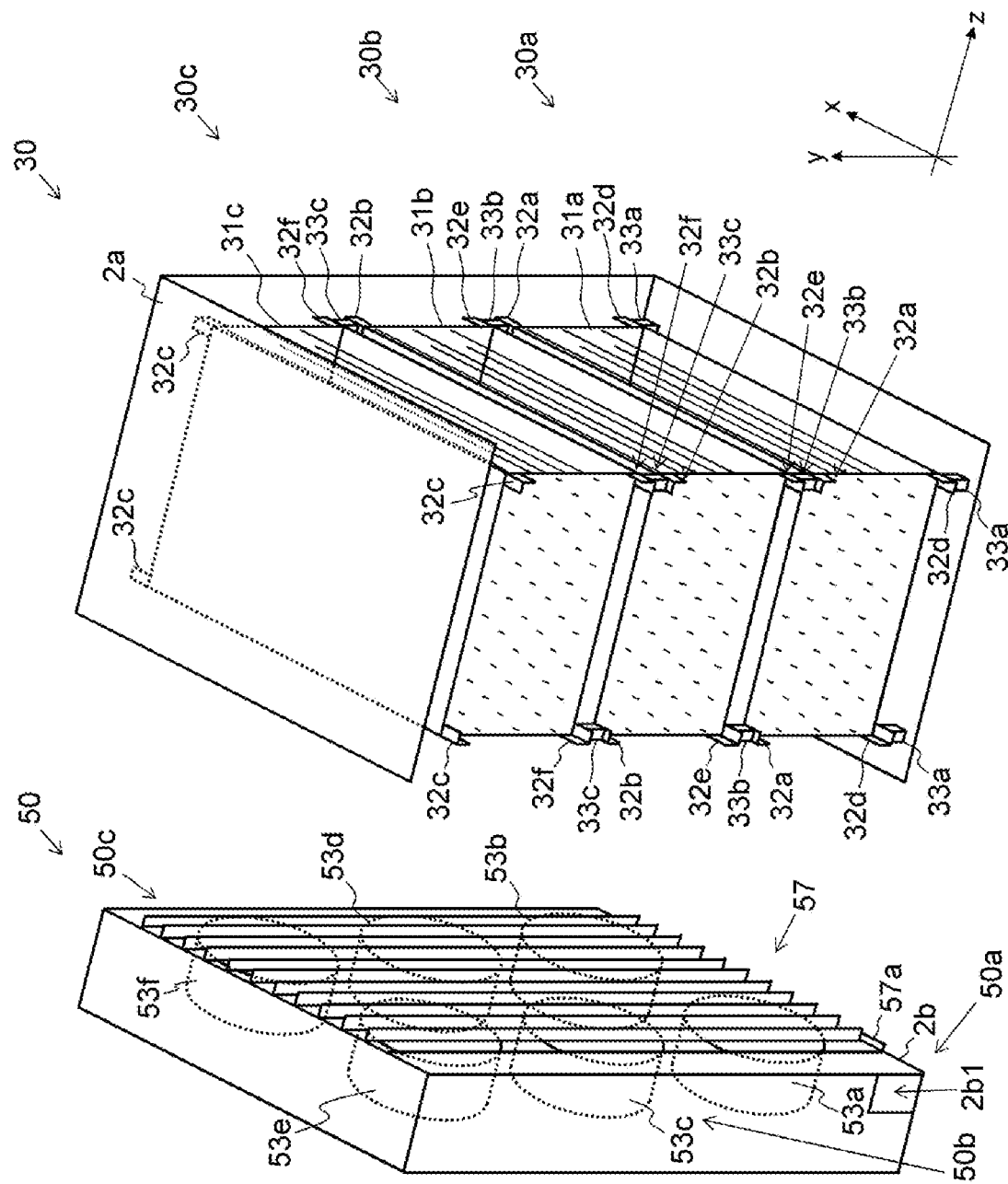
FIG. 11 is an exploded perspective view of a region including the cooling part including the diffusion part formed by an opening/closing door and the resistance unit including the projections.

The diffusion part 57 may be formed of an opening/closing door that closes the exhaust ports of the cooling devices (the first cooling device 53a to the sixth cooling device 53f) of the cooling part 50 (see FIG. 11).

In this case, during the non-use period, the diffusion part 57 closes the exhaust ports of the cooling devices (the first cooling device 53a to the sixth cooling device 53f) of the cooling part 50 by urging, and during the use period, the opening/closing door is pushed open by cooling air, and the diffusion part 57 opens the exhaust ports of the cooling devices (the first cooling device 53a to the sixth cooling device 53f) of the cooling part 50.

Accordingly, during the non-use period, no air flows into the resistance unit 30 so that dust and the like hardly enter from the outside.

Said opening/closing door is desirably provided with a stopper 57a to suppress the opening/closing door from opening when the cooling devices (the first cooling device 53a to the sixth cooling device 53f) of the cooling part 50 are in the off state and to release the opening/closing door from said suppressed state when the cooling device are in the on state (see FIG. 11).

The stopper 57a is on/off controlled in conjunction with the on/off state of the first cooling device 53a and the like.

Specifically, when at least one of the first cooling device 53a to the sixth cooling device 53f is set to the on state, the stopper 57a releases the opening/closing door from the opening-suppressed state, and the opening/closing door is opened by cooling air.

When all of the first cooling device 53a to the sixth cooling device 53f are set to the off state, the opening/closing door is closed, and then the stopper 57a suppresses the opening/closing door from opening and keeps the opening/closing door in the closed state.

This can prevent the opening/closing door from being opened by the wind when the cooling devices are not used.

Like said opening/closing door, an opening/closing door that is biased to be closed and that is opened by the negative pressure of cooling air may be provided at the intake ports of the cooling part 50.

In this case, the intake ports of the cooling part 50 can be closed during the non-use period and can be opened during the use period, without protruding from the cooling part 50 in the z direction, compared to a mode providing the intake port hoods.

Like said opening/closing door, an opening/closing door that is biased to be closed and that is pressed open by cooling air may be provided at the exhaust ports of the resistance unit 30.

In this case, the exhaust ports of the resistance unit 30 can be closed during the non-use period and can be opened during the use period, without protruding from the resistance unit 30 in the z direction, compared to a mode providing the exhaust port hoods.

It is described that the first insulators 33a connecting the first resistance unit 30a and the first housing 2a are attached to the lower portion of the first holding part 31a.

Similarly, it is described that the second insulators 33b connecting the second resistance unit 30b and the first resistance unit 30a are attached to the lower portion of the second holding part 31b.

Similarly, it is described that the third insulators 33c connecting the third resistance unit 30c and the second resistance unit 30b are attached to the lower portion of the third holding part 31c.

However, projections that protrude in the horizontal direction (the x direction, the z direction, etc.) from the upper and lower portions of a rectangular parallelepiped (holding part) constituting the outer shape of each resistance unit may be provided so that insulators are attached between said projections. (See FIGS. 9 and 10).

Specifically, first upper projections 32a protruding in the x direction are provided on the upper portion of the first holding part 31a.

Second upper projections 32b protruding in the x direction are provided on the upper portion of the second holding part 31b.

Third upper projections 32c protruding in the x direction are provided on the upper portion of the third holding part 31c.

First lower projections 32d protruding in the x direction are provided on the lower portion of the first holding part 31a.

Second lower projections 32e protruding in the x direction are provided on the lower portion of the second holding part 31b.

Third lower projections 32f protruding in the x direction are provided on the lower portion of the third holding part 31c.

The first upper projections 32a to the third upper projections 32c each have a substantially L-shape when viewed from the x direction, and include a first surface parallel to an xz plane and a second surface parallel to an xy plane extending downward from the first surface in the y direction.

The first lower projections 32d to the third lower projections 32f each have a substantially L-shape when viewed from the x direction, and include a third surface parallel to the xz plane and a fourth surface parallel to the xy plane extending upward from the third surface in the y direction.

The first insulators 33a are attached between the third surface of the first lower projections 32d and the first housing 2a.

The second insulators 33b are attached between the third surface of the second lower projections 32e and the first surface of the first upper projections 32a.

The third insulators 33c are attached between the third surface of the third lower projections 32f and the first surface of the second upper projections 32b.

The insulators can be screwed using an empty space below the upper projection and an empty space above the lower projection. Thus, the insulators can be easily installed as compared to a mode in which the insulators are installed on the lower portion of the holding part.

Figure 10:
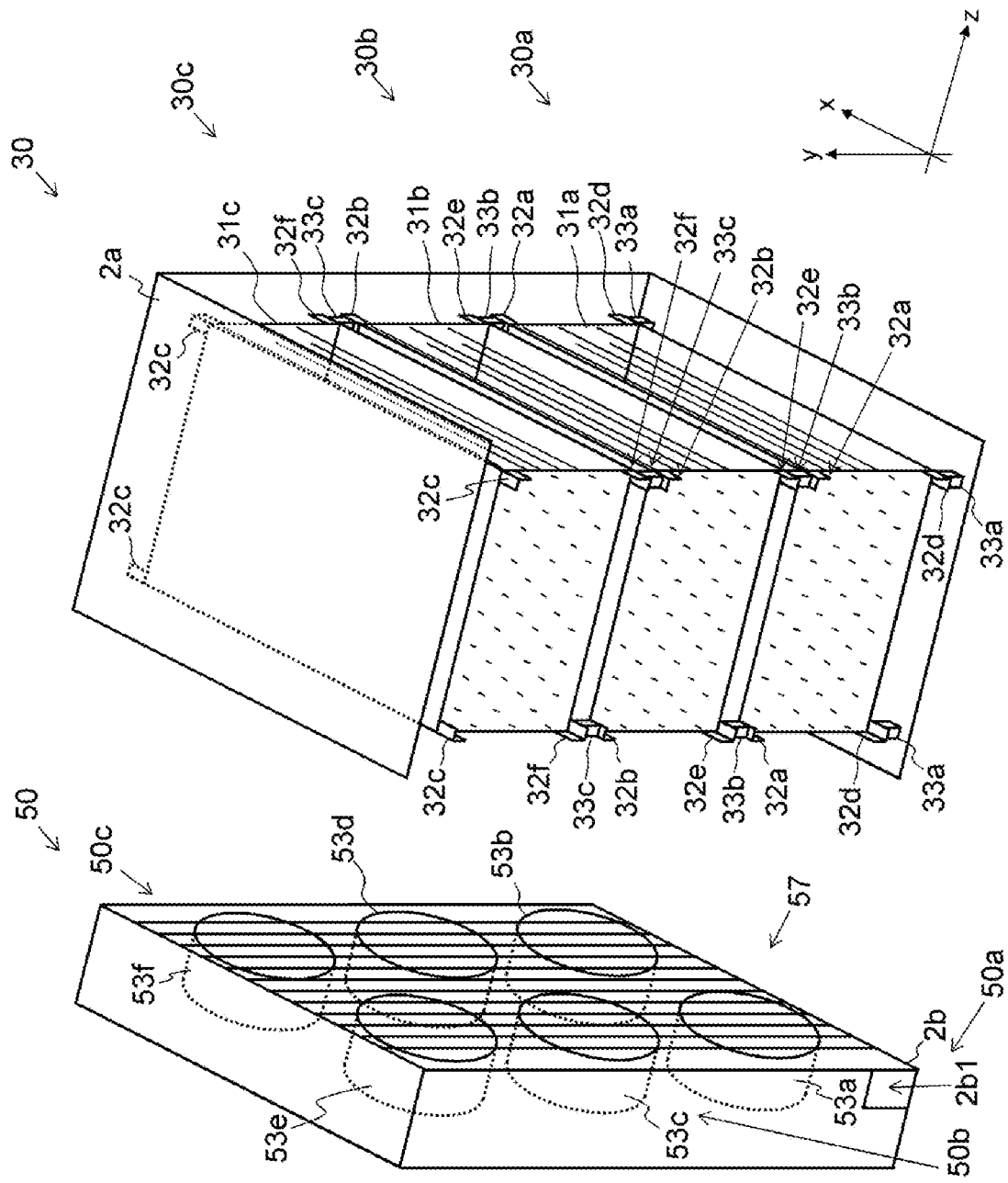
FIG. 10 is an exploded perspective view of a region including the cooling part including the diffusion part and the resistance unit including the projections.
Figure 20:
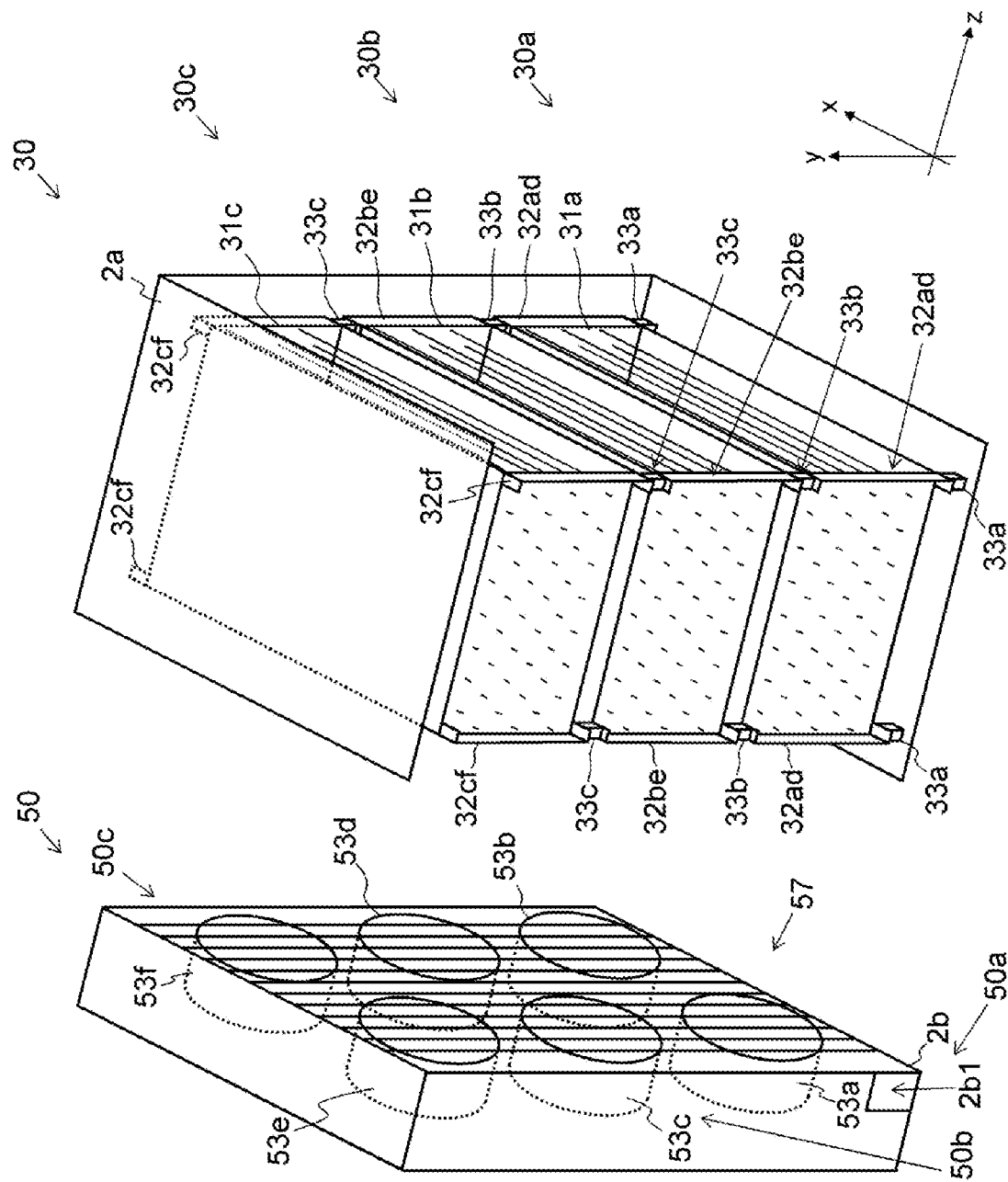
FIG. 20 is an exploded perspective view of a region including the cooling part including the diffusion part and the resistance unit including a rod-shaped protruding region.

The upper projections and the lower projections protruding in the x direction of one holding part may be separately formed as shown in FIGS. 9 to 11 or may be integrally formed as shown in FIGS. 20 and 21.

In the case that the portions corresponding to the upper projections and the portions corresponding to the lower projections are integrally formed, the first holding part 31a has a first protruding region 32ad that protrudes in the x direction.

The second holding part 31b has a second protruding region 32be that protrudes in the x direction.

The third holding part 31c has a third protruding region 32cf that protrudes in the x direction.

The first protruding region 32ad, the second protruding region 32be, and the third protruding region 32cf each have a substantially U shape (see FIG. 20) or a substantially rectangular shape (see FIG. 21) when viewed from the x direction, and have upper and lower surfaces parallel to the xz plane and side surfaces connecting the upper and lower surfaces.

The first insulators 33a are attached between the lower portion (lower surface) of the first protruding region 32ad and the first housing 2a.

The second insulators 33b are attached between the lower portion (lower surface) of the second protruding region 32be and the upper portion (upper surface) of the first protruding region 32ad.

The third insulators 33c are attached between the lower portion (lower surface) of the third protruding region 32cf and the upper portion (upper surface) of the second protruding region 32be.

The portion corresponding to the upper projection and the portion corresponding to the lower projection are integrally formed as the protruding region, so that it is possible to increase the strength of the part to which the insulator is attached as compared to a mode in which the upper projection and the lower projection are separately formed.

In particular, as shown in FIG. 21, forming the protruding regions in a frame shape makes it possible to further increase the strength as compared to the mode in which the protruding regions are formed in a bar shape as shown in FIG. 20.

Figure 12:
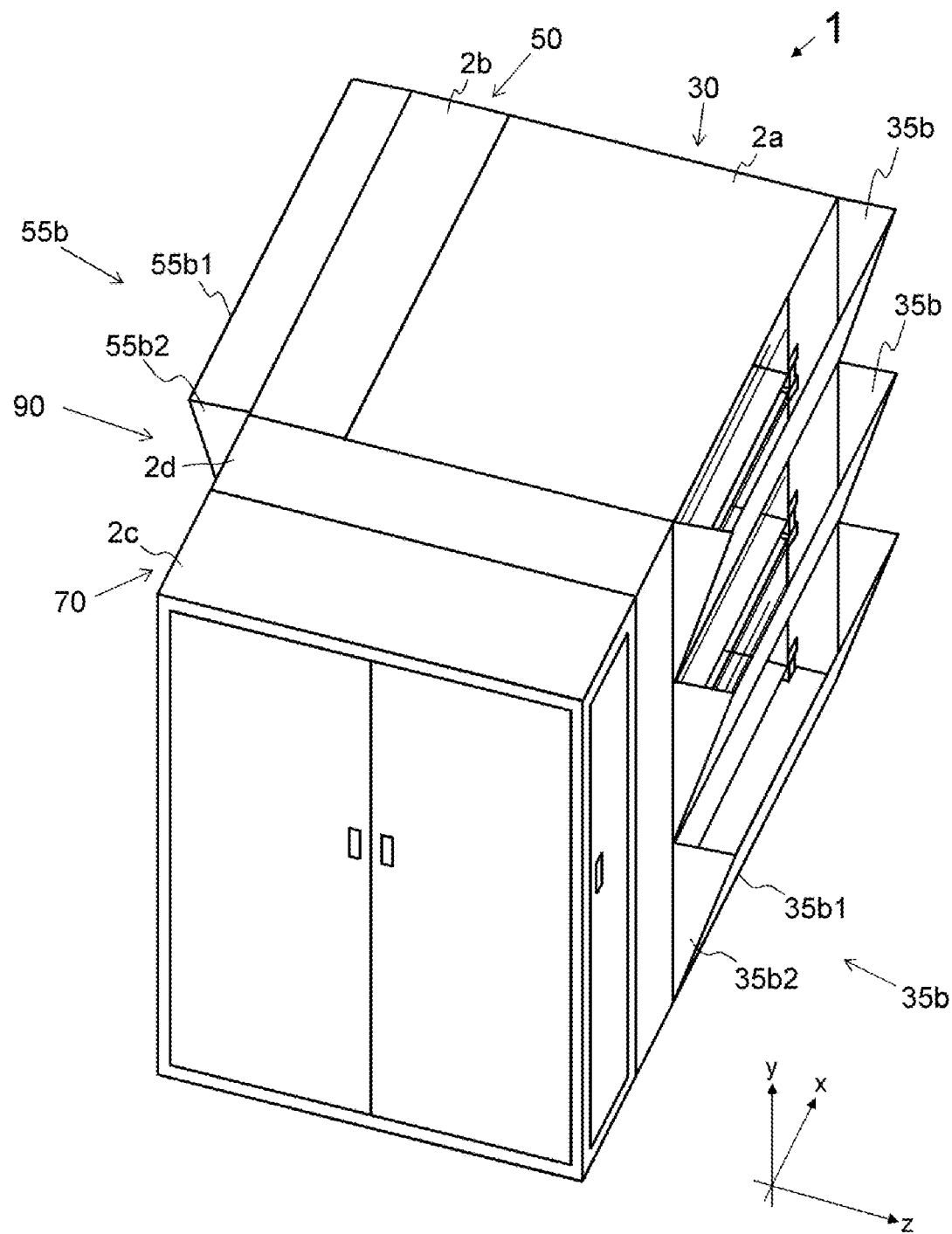
FIG. 12 is a perspective view of the load test apparatus provided with second exhaust port hoods and second intake port hoods.

Second exhaust port hoods 35b may be provided at the exhaust port of the resistance unit 30, and second intake port hoods 55b may be provided at the intake port of the cooling part 50 (see FIG. 12).

The second exhaust port hoods 35b each have a first lower surface portion 35b1 and a third side surface portion 35b2.

The second exhaust port hoods 35b protrude in the z direction from the exhaust port of the resistance unit 30 and open upward or obliquely upward.

The second intake port hoods 55b each have a second lower surface portion 55b1 and a fourth side surface portion 55b2.

The second intake port hoods 55b protrude in the z direction from the intake port of the cooling part 50 and open upward or obliquely upward.

The cooling part 50 sucks air from upward or obliquely upward through the second intake port hoods 55b, and the sucked air is discharged upward or obliquely upward through the resistance unit 30 and the second exhaust port hoods 35b.

In this case, the hot air discharged through the second exhaust port hoods 35b can be less likely to hit an operator or the like near the second exhaust port hoods 35b.

However, since rain or snow may enter through the openings that opens upward or obliquely upward, it is desirably to provide the roof part 2e that covers the upper parts of the first housing 2a to the fourth housing 2d, the second exhaust port hoods 35b, and the second intake port hoods 55b (see FIG. 13).

Further, in the embodiment shown in FIGS. 1 to 13, only one set of the resistance unit 30, the cooling part 50, and the relay part 90 is provided. Alternatively, a plurality of sets may be provided such that a load test is performed using one control part 70 and the plurality of sets of resistance units 30, cooling parts 50, and relay parts 90 (see FIG. 14).

Figure 14:
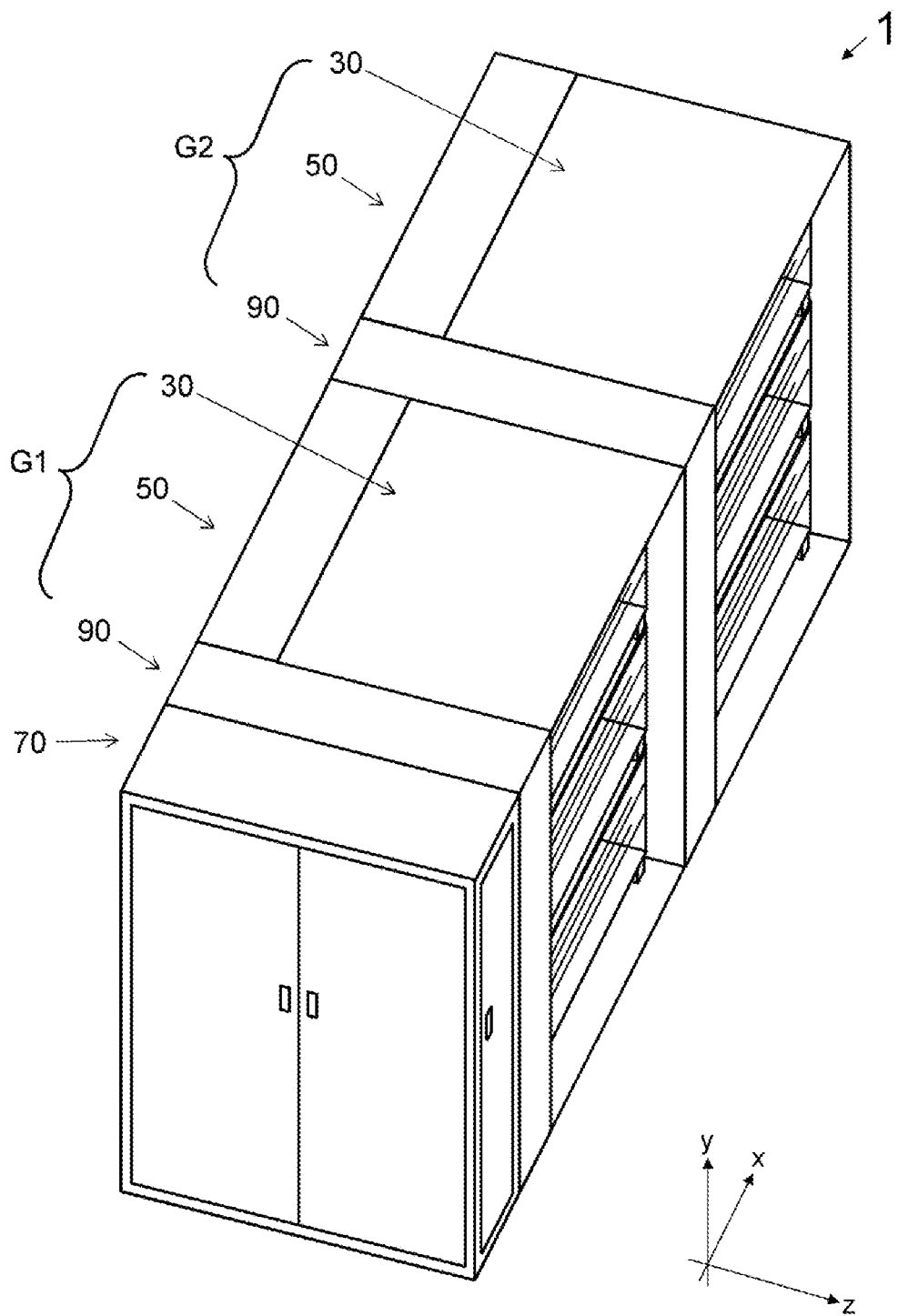
FIG. 14 is a perspective view of the load test apparatus including a first resistance group and a second resistance group including a relay part.
Figure 15:
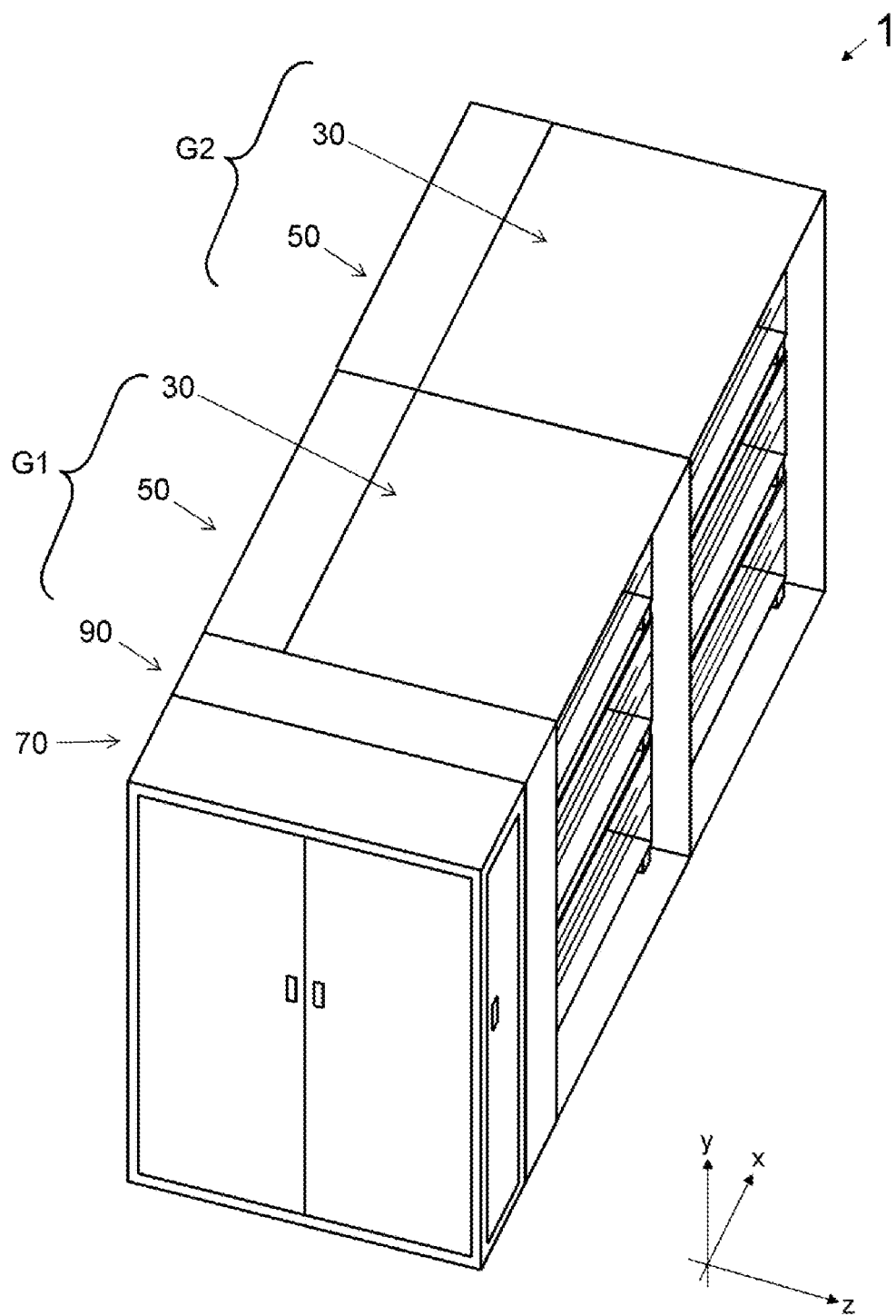
FIG. 15 is a perspective view of the load test apparatus including the first resistance group and the second resistance group not including the relay part.

FIG. 14 shows an example in which the load test apparatus 1 has a first resistance group G1 including the relay part 90 adjacent to the control part 70 in the x direction, and a second resistance group G2 adjacent to the first resistance group G1 in the x direction.

In this case, it is preferable that the surfaces of the first housing 2a and the second housing 2b of the first resistance group G1 in contact with the second resistance group G2 have at least an opening through which a cable is passed.

This makes it possible to assemble the load test apparatus 1 in a state where most cables are not visible outside the housing.

In addition, a third resistance group (not shown) adjacent to the second resistance group G2 in the x direction may be further provided.

The components of the control part 70 (the operation part 71, the control terminal part 75, and the power supply control part 77) are connected to the cooling fan or the like of the first resistance group G1 and are connected to the cooling fan or the like of the second resistance group G2.

The number of resistor groups provided in each of the resistance units 30 in the second resistance group G2 may be the same as or smaller than the number of resistor groups provided in each of the resistance units 30 in the first resistance group G1.

That is, the number of switching devices (the first U-phase switching device $SU_1$ and others) in the relay part 90 of the first resistance group G1 that performs a power supply control on the resistor groups in the first resistance unit 30a to the third resistance unit 30c of the first resistance group G1 is larger than the number of switching devices in the relay part 90 of the second resistance group G2 that performs a power supply control on the resistor groups in the first resistance unit 30a to the third resistance unit 30c of the second resistance group G2.

In this case, the first resistance group G1 is mainly used to perform a load test with a small switching width of load resistance value. The second resistance group G2 is mainly used to perform a load test with a large switching width of load resistance value. Both the first resistance group G1 and the second resistance group G2 are used to perform a load test with a large load resistance value.

This makes it possible to perform a load test with a large load while sharing the control part 70, as compared with a mode in which only the first resistance group G1 is provided.

Figure 16:
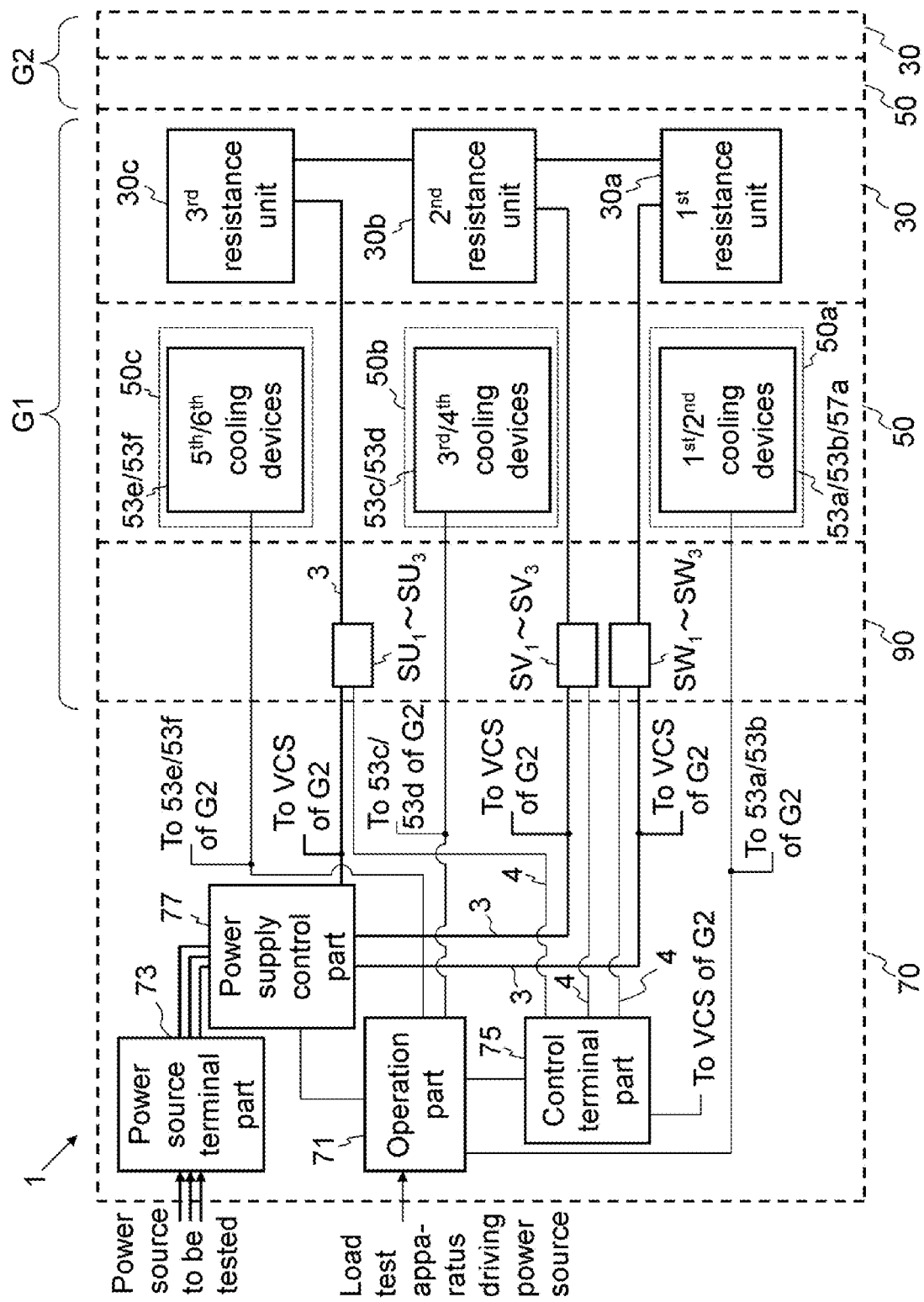
FIG. 16 is a schematic diagram of the load test apparatus including the first resistance group and the second resistance group not including the relay part, which shows in detail a portion including the first resistance group.
Figure 17:
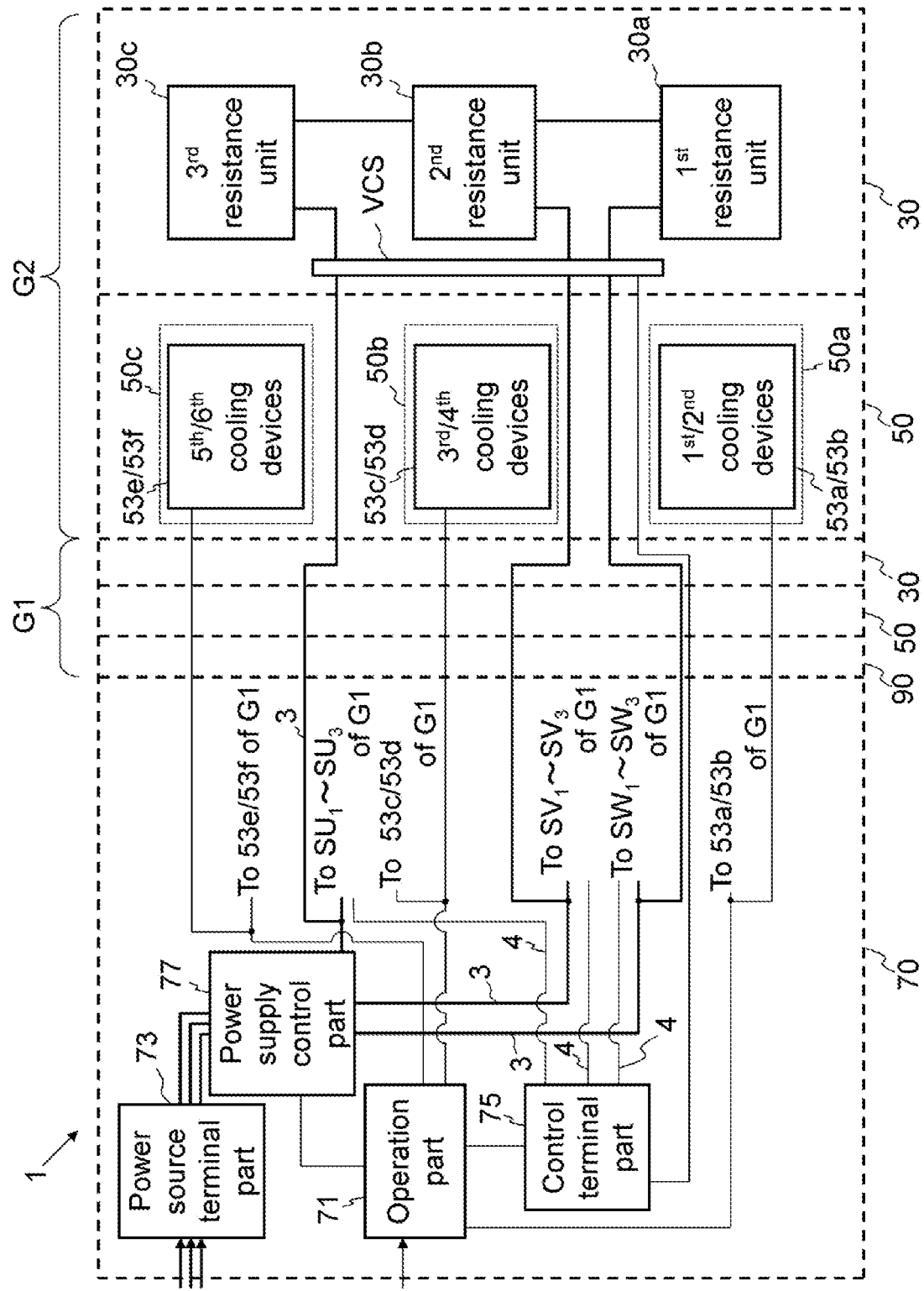
FIG. 17 is a schematic diagram of the load test apparatus including the first resistance group and the second resistance group not including the relay part, which shows in detail a portion including the second resistance group.

When each one resistor group is provided in the resistance units 30 of the second resistance group G2, the relay part 90 is not provided in the second resistance group G2 so that the power supply control part 77 in the control part 70 and the resistor group provided in each of the resistance units 30 of the second resistance group G2 are connected together via not the relay part 90 but a vacuum switch (VCS) (see FIGS. 16 and 17).

FIG. 16 shows a connection relationship between the first resistance group G1 and the control part 70 in the load test apparatus 1, and does not show details of the second resistance group G2.

FIG. 17 shows a connection relationship between the second resistance group G2 and the control part 70 in the load test apparatus 1, and does not show details of the first resistance group G1.

The VCS may be provided in the resistance units 30 of the second resistance group G2 or may be provided in the control part 70.

Figure 18:
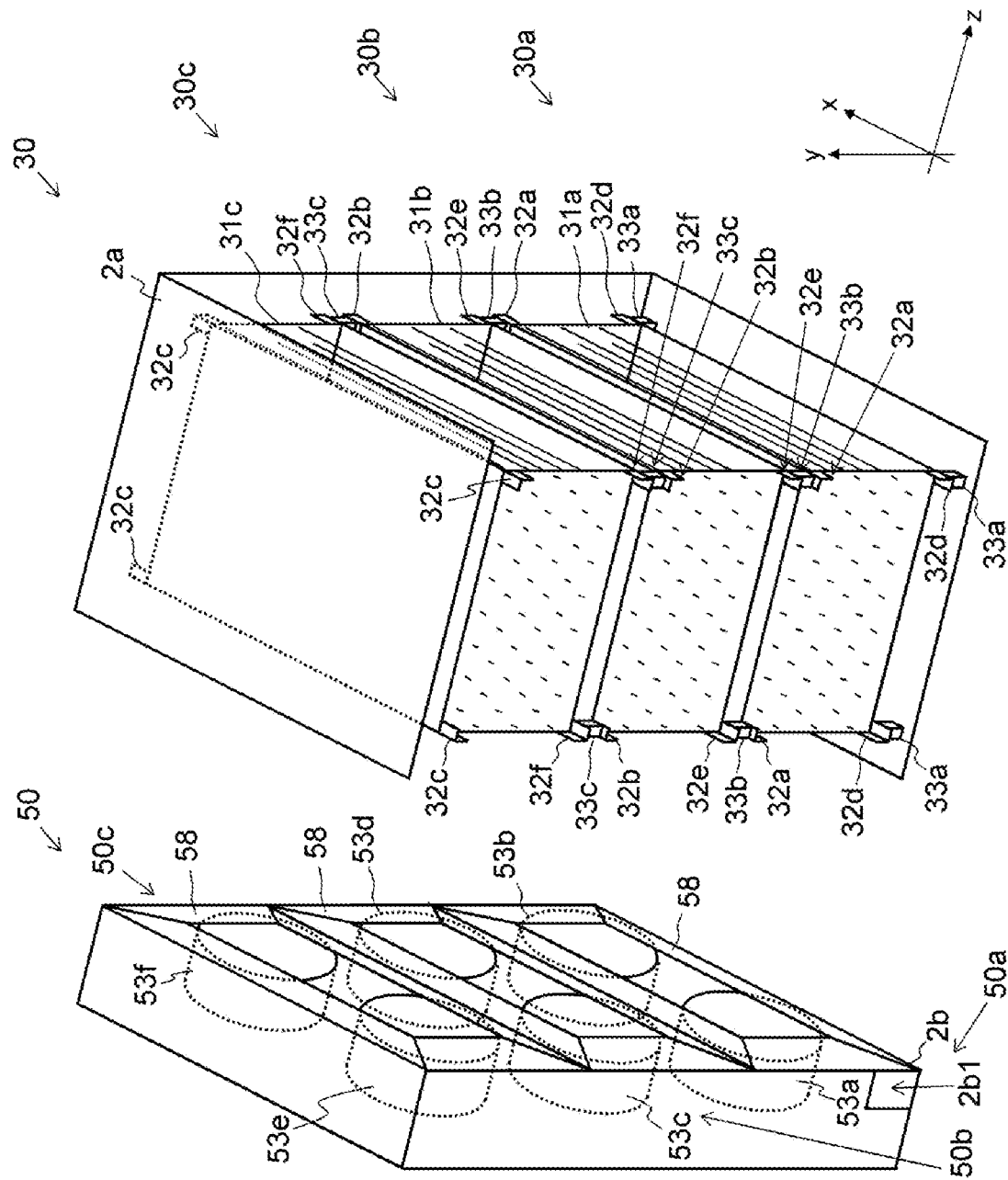
FIG. 18 is an exploded perspective view of a region including the cooling part including constriction portions and the resistance unit including the projections.

Further, there may be provided hoods of constriction structure (constriction portions 58) between the cooling part 50 and the resistance unit 30 to concentrate cooling air on the resistors in the resistance unit 30 (see FIG. 18).

The constriction portions 58 each have a generally quadrangular truncated pyramid outside shape with a wide lower bottom (lower-bottom opening) on the cooling part 50 side and a narrow upper bottom (upper-bottom opening) on the resistance unit 30 side such that the lower bottom and the upper bottom are opened.

The upper bottom of the lower constriction portion 58 is arranged inside the first holding part 31a, not in contact with the first holding part 31a.

The upper bottom of the middle constriction portion 58 is arranged inside the second holding part 31b, not in contact with the second holding part 31b.

The upper bottom of the upper constriction portion 58 is arranged inside the third holding part 31c, not in contact with the third holding part 31c.

Providing the constriction portions 58 makes it possible to focus cooling air from the cooling part 50 on the inside of the first holding part 31a to the third holding part 31c.

The constriction portions 58 may be further provided with diffusion parts 57 (see FIG. 19).

FIG. 19 shows an example in which the rod-shaped diffusion parts 57 are provided in the upper bottom openings of the constriction portions 58.

Although several embodiments of the present invention have been described, these embodiments are presented as examples and are not intended to limit the scope of the invention. These embodiments can be implemented in other various forms, and can be omitted, replaced, and changed in various manners without departing from the gist of the invention. These embodiments and modifications thereof are included in the scope and gist of the invention, and are also included in the invention described in the claims and equivalents thereof.

REFERENCE SIGNS LIST

1 Load test apparatus
1a to 1c First load test part to third load test part
2a First housing (resistance unit housing)

2a1 First opening
2b Second housing (cooling part housing)
2b1 Second opening
2c Third housing (control part housing)
2d Fourth housing (relay part housing)
2e Roof part
2f Base part
3 Connection member
4 Control line
30 Resistance unit
30a to 30c First resistance unit to third resistance unit
31a to 31c First holding part to third holding part
31a1 to 31c1 First opening to third opening
32a to 32c First upper projection to third upper projection
32d to 32f First lower projection to third lower projection
32ad First protruding region
32be Second protruding region
32cf Third protruding region
33a to 33c First insulator to third insulator
35a First exhaust port hood
35a1 First upper surface portion
35a2 First side surface portion
35b Second exhaust port hood
35b1 First lower surface portion
35b2 Third side surface portion
50 Cooling part
50a to 50c First cooling part to third cooling part
53a to 53f First cooling device to sixth cooling device
55a First intake port hood
55a1 Second upper surface portion
55a2 Second side surface portion
55b Second intake port hood
55b1 Second lower surface portion
55b2 Fourth side surface portion
57 Diffusion part
57a Stopper
58 Constriction portion
70 Control part
71 Operation part
73 Power source terminal part
75 Control terminal part
77 Power supply control part
90 Relay part
FS Fan switch
G1 First resistance group
G2 Second resistance group
MS Mode switch
$RU_1$ to $RU_3$ First U-phase resistor group to third U-phase resistor group
$RV_1$ to $RV_3$ First V-phase resistor group to third V-phase resistor group
$RW_1$ to $RW_3$ First W-phase resistor group to third W-phase resistor group
S1 to S3 First operation switch to third operation switch
$SU_1$ to $SU_3$ First U-phase switching device to third U-phase switching device
$SV_1$ to $SV_3$ First V-phase switching device to third V-phase switching device
$SW_1$ to $SW_3$ First W-phase switching device to third W-phase switching device
UT U-phase terminal
VT V-phase terminal
WT W-phase terminal

The invention claimed is:

1. A load test apparatus comprising:
a first resistance unit that has a plurality of first resistors and a first holding part holding the plurality of first resistors; and
a first cooling part that includes a cooling device sending cooling air to the plurality of first resistors; wherein
the cooling device in the first cooling part faces one first opening in the first holding part,
the first holding part is arranged on a housing that holds the first resistance unit with a first insulator therebetween,
a first lower projection protrudes in a horizontal direction from a lower portion of the first holding part, and
the first lower projection, the first insulator, and a bottom inner surface of the housing are arranged in order in a vertical direction, such that the first insulator is attached between the first lower projection and the bottom inner surface of the housing.

2. The load test apparatus according to claim 1, further comprising:
a second resistance unit that has a plurality of second resistors and a second holding part holding the plurality of second resistors;
a second cooling part that includes a cooling device sending cooling air to the plurality of second resistors,
a third resistance unit that has a plurality of third resistors and a third holding part holding the plurality of third resistors; and
a third cooling part that includes a cooling device sending cooling air to the plurality of third resistors, wherein
the second holding part is arranged on the first holding part with a second insulator therebetween,
the cooling device in the second cooling part faces one second opening in the second holding part,
the third holding part is arranged on the second holding part with a third insulator therebetween,
the cooling device in the third cooling part faces one third opening in the third holding part,
a lower surface and side surface of the first resistance unit, a side surface of the second resistance unit, and an upper surface and a side surface of the third resistance unit are covered by the housing,
a first upper projection protrudes in the horizontal direction from an upper portion of the first holding part,
a second lower projection protrudes in the horizontal direction from a lower portion of the second holding part,
the second lower projection, the second insulator, and the first upper projection are arranged in order in a vertical direction, such that the second insulator is attached between the second lower projection and the first upper projection,
a second upper projection protrudes in the horizontal direction from an upper portion of the second holding part,
a third lower projection protrudes in the horizontal direction from a lower portion of the third holding part, and
the third lower projection, the third insulator, and the second upper projection are arranged in order in a vertical direction, such that the third insulator is attached between the third lower projection and the second upper projection.

3. The load test apparatus according to claim 1, wherein
a diffusion part for diffusing cooling air is provided between the first cooling part and the first resistance unit, the diffusion part includes an opening/closing door that closes an exhaust port of the first cooling part by urging, and the opening/closing door is opened by cooling air discharged from the first cooling part.

4. The load test apparatus according to claim 1, wherein at least one of an intake port and an exhaust port of the first cooling part and an exhaust port of the first resistance unit has an opening/closing door that is closed by urging and is opened by cooling air from the first cooling part.

5. The load test apparatus according to claim 1, further comprising:
- a control part that includes a power source terminal port connected to a power source to be tested and an operation part; and
- a relay part that includes a switching device connected to the power source terminal part and the first resistance unit, wherein
- a plurality of resistance groups and the relay parts is provided, each of the resistance groups having a resistance unit which includes the first resistance unit and having a cooling part which includes the first cooling part,
- the plurality of resistance groups is connected to the control part,
- the plurality of resistance groups includes a first resistance group and a second resistance group, and
- the number of the switching devices in the relay part corresponding to the first resistance group that performs a power supply control on the first resistance unit of the first resistance group is larger than the number of the switching devices in the relay part corresponding to the second resistance group that performs a power supply control on the first resistance unit of the second resistance group.

6. The load test apparatus according to claim 1, further comprising:
- a control part that includes a power source terminal part connected to a power source to be tested and an operation part; and
- a relay part that includes a switching device connected to the power source terminal part and the first resistance unit, wherein
- a plurality of resistance groups is provided, each of the resistance groups having a resistance unit which includes the first resistance unit and having a cooling part which includes the first cooling part, and
- at least one of the plurality of resistance groups is connected to the control part via the relay part, and the rest of the plurality of resistance groups is connected to the control part via not the relay part but a VCS provided in the control part or in the resistance unit of the rest of the plurality of resistance groups.

7. The load test apparatus according to claim 1, wherein an exhaust port hood is provided at the exhaust port of the first resistance unit, and the exhaust port hood is biased to close and is opened by cooling air from the first cooling part.

8. The load test apparatus according to claim 1, further comprising:
- a control part that includes a power source terminal part connected to a power source to be tested and an operation part; and
- a relay part that includes a switching device connected to the power source terminal part and the first resistance unit, wherein
- an exhaust port hood is provided at the exhaust port of the first resistance unit,
- an intake port hood is provided at the intake port of the first cooling part, and
- the load test apparatus further comprises:
- a roof part that covers an upper part of a housing covering the first resistance unit, the cooling part, the control part, and the relay part; and
- a base part that is provided at a lower part of the housing, wherein
- the roof part has a hipped roof.

9. The load test apparatus according to claim 1, further comprising:
- a control part that includes a power source terminal part connected to a power source to be tested and an operation part; and
- a relay part that includes a switching device connected to the power source terminal part and the first resistance unit, wherein
- an exhaust port hood opened upward or obliquely upward is provided at the exhaust port of the first resistance unit,
- an intake port hood opened upward or obliquely upward is provided at the intake port of the first cooling part, and
- the housing covers the first resistance unit, the cooling part, the control part, and the relay part;
- the load test apparatus further comprises:
- a roof part that covers upper portions of the exhaust port hood and the intake port hood.

10. The load test apparatus according to claim 1, wherein a portion corresponding to the first upper projection and a portion corresponding to the first lower projection are integrally formed, and
a portion corresponding to the second upper projection and a portion corresponding to the second lower projection are integrally formed.

11. The load test apparatus according to claim 1, wherein a portion corresponding to the first upper projection and a portion corresponding to the first lower projection are integrally formed, in a rectangular frame shape when viewed from the horizontal direction, and
a portion corresponding to the second upper projection and a portion corresponding to the second lower projection are integrally formed, in a rectangular frame shape when viewed from the horizontal direction.

* * * * *